(12) United States Patent
Li et al.

(10) Patent No.: US 12,372,825 B2
(45) Date of Patent: Jul. 29, 2025

(54) DISPLAY APPARATUS SUBSTRATE, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Li, Beijing (CN); Zhonglin Cao, Beijing (CN); Jing He, Beijing (CN); Pengcheng Zang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 749 days.

(21) Appl. No.: 17/433,786

(22) PCT Filed: Dec. 30, 2020

(86) PCT No.: PCT/CN2020/141377
§ 371 (c)(1),
(2) Date: Aug. 25, 2021

(87) PCT Pub. No.: WO2021/136371
PCT Pub. Date: Jul. 8, 2021

(65) Prior Publication Data
US 2022/0146893 A1 May 12, 2022

(30) Foreign Application Priority Data
Jan. 2, 2020 (CN) .......................... 202020007120.5

(51) Int. Cl.
*G02F 1/1335* (2006.01)
*G02F 1/1362* (2006.01)
(Continued)

(52) U.S. Cl.
CPC .. *G02F 1/133512* (2013.01); *G02F 1/136209* (2013.01); *H10D 86/441* (2025.01);
(Continued)

(58) Field of Classification Search
CPC ......... G02F 1/136209; G02F 1/133512; G02F 1/1368; G02F 2201/56; H01L 27/124;
(Continued)

(56) References Cited

U.S. PATENT DOCUMENTS

2007/0126969 A1\* 6/2007 Kimura ............. G02F 1/133371
349/141
2009/0115933 A1 5/2009 Mimura
(Continued)

FOREIGN PATENT DOCUMENTS

CN 101849255 A 9/2010
CN 105206213 A 12/2015
(Continued)

*Primary Examiner* — Steven B Gauthier
*Assistant Examiner* — Alvin L Lee
(74) *Attorney, Agent, or Firm* — XSENSUS LLP

(57) ABSTRACT

A display apparatus substrate includes a non-rectangular display region. The display region includes a main display region and edge display region(s) at the periphery of the main display region. The display region is provided with a plurality of pixels therein, and each pixel includes at least three sub-pixels. The display apparatus substrate includes a black matrix pattern and first metal patterns disposed in the edge display region(s). A portion of the black matrix pattern in the edge display area(s) has first openings, and a first opening is disposed in one corresponding sub-pixel in the edge display area(s). A first metal pattern corresponds to one first opening and is disposed in the corresponding sub-pixel, and an orthogonal projection of the first metal pattern on a (Continued)

reference plane overlapping a partial region of an orthogonal projection of the corresponding first opening on the reference plane.

19 Claims, 16 Drawing Sheets

(51) Int. Cl.
- *G02F 1/1368* (2006.01)
- *H10D 86/40* (2025.01)
- *H10D 86/60* (2025.01)
- *H10K 50/86* (2023.01)
- *H10K 59/122* (2023.01)
- *H10K 59/131* (2023.01)
- *H10K 59/35* (2023.01)
- *H10K 59/38* (2023.01)
- *H10K 59/80* (2023.01)

(52) U.S. Cl.
CPC ........... *H10D 86/60* (2025.01); *H10K 50/865* (2023.02); *H10K 59/131* (2023.02); *H10K 59/8792* (2023.02); *G02F 1/1368* (2013.01); *G02F 2201/56* (2013.01); *H10K 59/122* (2023.02); *H10K 59/35* (2023.02); *H10K 59/38* (2023.02)

(58) Field of Classification Search
CPC .......... H01L 27/1218; H10K 50/865; H10K 59/131; H10K 59/122; H10K 59/35; H10K 59/38; H10K 59/8792

See application file for complete search history.

(56) References Cited

U.S. PATENT DOCUMENTS

| | | | |
|---|---|---|---|
| 2010/0156950 A1* | 6/2010 | Pak | G02B 5/201 345/690 |
| 2010/0214195 A1 | 8/2010 | Ogasawara et al. | |
| 2018/0024405 A1* | 1/2018 | Koide | G02F 1/1368 257/72 |
| 2018/0095334 A1* | 4/2018 | Zang | G02F 1/133707 |
| 2018/0149932 A1* | 5/2018 | Nakamura | G02F 1/134336 |
| 2020/0365102 A1* | 11/2020 | Chang | G09G 3/36 |
| 2021/0333658 A1* | 10/2021 | Long | G02F 1/133707 |
| 2021/0367002 A1 | 11/2021 | Deng et al. | |

FOREIGN PATENT DOCUMENTS

| | | | |
|---|---|---|---|
| CN | 107507522 A | 12/2017 | |
| CN | 207780441 U * | 8/2018 | ........ G02F 1/133707 |
| CN | 108732834 A | 11/2018 | |
| CN | 110058448 A | 7/2019 | |
| CN | 211718666 U | 10/2020 | |
| JP | 2006276580 A | 10/2006 | |
| WO | 2007132574 A1 | 11/2007 | |

* cited by examiner

US 12,372,825 B2

DISPLAY APPARATUS SUBSTRATE, AND DISPLAY APPARATUS

CROSS-REFERENCE TO RELATED APPLICATIONS

This application is a national phase entry under 35 USC 371 of International Patent Application No. PCT/CN2020/141377, filed on Dec. 30, 2020, which claims priority to Chinese Patent Application No. 202020007120.5, filed on Jan. 2, 2020, which is incorporated herein by reference in their entirety.

TECHNICAL FIELD

The present disclosure relates to the field of display technologies, and in particular, to a display apparatus substrate and a display apparatus.

BACKGROUND

With the rapid development of display technologies, there are more and more special-shaped display apparatuses with non-rectangular display regions. Emergence of the special-shaped display apparatuses breaks through a limitation that display apparatuses have display regions with a single rectangular structure, so that applications of the special-shaped display apparatuses are made more and more widespread. For example, at present, the special-shaped display apparatuses have been widely used in the intelligent wearing field, the intelligent vehicle-mounted field, and other fields.

SUMMARY

In one aspect, a display apparatus substrate is provided. The display apparatus substrate has a non-rectangular display region. The display region includes a main display region and edge display region(s) located at a periphery of the main display region. The display region is provided with a plurality of pixels therein, and each pixel includes at least three sub-pixels. The display apparatus substrate includes a black matrix pattern and a plurality of first metal patterns. A portion of the black matrix pattern located in the edge display region(s) has a plurality of first openings, and a first opening is disposed in one corresponding sub-pixel in the edge display region(s); the plurality of first metal patterns are disposed in the edge display region(s), and a first metal pattern corresponding to one first opening and is disposed in the corresponding sub-pixel; and an orthogonal projection of the first metal pattern on a reference plane overlaps a partial region of an orthogonal projection of the corresponding first opening on the reference plane, in which the reference plane is a plane perpendicular to a thickness direction of the display apparatus substrate.

In some embodiments, in the edge display region(s), areas of portions, which are not blocked by first metal patterns, of first openings in sub-pixels that belong to a same pixel are substantially the same.

In some embodiments, at least a part of a border of the orthogonal projection of the first opening on the reference plane is within the orthogonal projection of the corresponding first metal pattern on the reference plane.

In some embodiments, the first opening is strip-shaped, and the orthogonal projection of the first opening on the reference plane has two opposite long sides; and the two opposite long sides of the orthogonal projection of the first opening on the reference plane are within the orthogonal projection of the corresponding first metal pattern on the reference plane.

In some embodiments, the first metal pattern includes a first metal strip and a second metal strip; extension directions of the first metal strip and the second metal strip are substantially the same as an extension direction of the first opening; and the two opposite long sides of the orthogonal projection of the first opening on the reference plane are within orthogonal projections of the first metal strip and the second metal strip on the reference plane.

In some embodiments, the first metal pattern further includes a third metal strip and a fourth metal strip. The first metal strip, the second metal strip, the third metal strip and the fourth metal strip are connected to form a frame shape. The orthogonal projection of the first opening on the reference plane has two opposite short sides; and the two opposite short sides of the orthogonal projection of the first opening on the reference plane are within orthogonal projections of the third metal strip and the fourth metal strip on the reference plane.

In some embodiments, the display region further includes transition display region(s) located between the main display region and the edge display region(s); and a portion of the black matrix pattern located in the transition display region(s) has a plurality of second openings, and a second opening is disposed in corresponding sub-pixel in the transition display region(s). The display apparatus substrate further includes a plurality of second metal patterns disposed in the transition display region(s).

A second metal pattern corresponds to one second opening and is disposed in the corresponding sub-pixel; and an orthogonal projection of the second metal pattern on the reference plane overlaps a partial region of an orthogonal projection of the corresponding second opening on the reference plane.

In some embodiments, in the transition display region(s), areas of portions, which are not blocked by second metal patterns, of second openings in sub-pixels that belong to a same pixel are substantially the same.

In some embodiments, an area of a portion of the second opening located in the transition display region(s) that is not blocked by the second metal pattern is larger than an area of a portion of the first opening located in the edge display region(s) that is not blocked by the first metal pattern.

In some embodiments, a portion of the black matrix pattern located in the main display region has a plurality of third openings, and a third opening is disposed in one corresponding sub-pixel in the main display region. An area of the third opening is larger than the area of the portion of the second opening located in the transition display region(s) that is not blocked by the second metal pattern.

In some embodiments, the second opening is strip-shaped, and the orthogonal projection of the second opening on the reference plane has two opposite long sides; and the two opposite long sides of the orthogonal projection of the second opening on the reference plane are within the orthogonal projection of the corresponding second metal pattern on the reference plane.

In some embodiments, the second metal pattern includes a fifth metal strip and a sixth metal strip; extension directions of the fifth metal strip and the sixth metal strip are substantially the same as an extension direction of the second opening; and the two opposite long sides of the orthogonal projection of the second opening on the reference plane are within orthogonal projections of the fifth metal strip and the sixth metal strip on the reference plane.

In some embodiments, the second metal pattern further includes a seventh metal strip and an eighth metal strip. The fifth metal strip, the sixth metal strip, the seventh metal strip and the eighth metal strip are connected to form a frame shape. The orthogonal projection of the second opening on the reference plane has two opposite short sides; and the two opposite short sides of the orthogonal projection of the second opening on the reference plane are within orthogonal projections of the seventh metal strip and the eighth metal strip on the reference plane.

In some embodiments, the display apparatus substrate further includes a plurality of gate lines and a plurality of data lines; and the plurality of first metal patterns are made of a same material and arranged in a same layer as the plurality of gate lines or the plurality of data lines. And/or, in a case where the display apparatus substrate includes a plurality of the second metal patterns, the plurality of second metal patterns are made of a same material and arranged in a same layer as the plurality of gate lines or the plurality of data lines.

In some embodiments, the display apparatus substrate further includes a plurality of thin film transistors, and each thin film transistor includes a source and a drain; each sub-pixel includes at least one thin film transistor; and the first metal pattern is electrically connected to the source or the drain of a thin film transistor of a corresponding sub-pixel. And/or, in the case where the display apparatus substrate includes a plurality of second metal patterns, a second metal pattern is electrically connected to the source or the drain of a thin film transistor in a corresponding sub-pixel.

In some embodiments, the display apparatus substrate includes a first base and a second base; the plurality of first metal patterns are disposed on the first base, and the black matrix pattern is disposed on the second base; and in a case where the display apparatus substrate includes a plurality of second metal patterns, the plurality of second metal patterns are disposed on the first base. Or, the display apparatus substrate includes a base; the base, the black matrix pattern, and the plurality of first metal patterns are all disposed on the base; and in the case where the display apparatus substrate includes the plurality of second metal patterns, the plurality of second metal patterns are disposed on the base.

In another aspect, a display apparatus is provided. The display apparatus includes the display apparatus substrate according to any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, an actual process of a method and actual timings of signals involved in the embodiments of the present disclosure.

FIG. 8B is an enlarged view of a sub-pixel located in the edge display region in

FIG. 8A;

DETAILED DESCRIPTION

Figure 1:
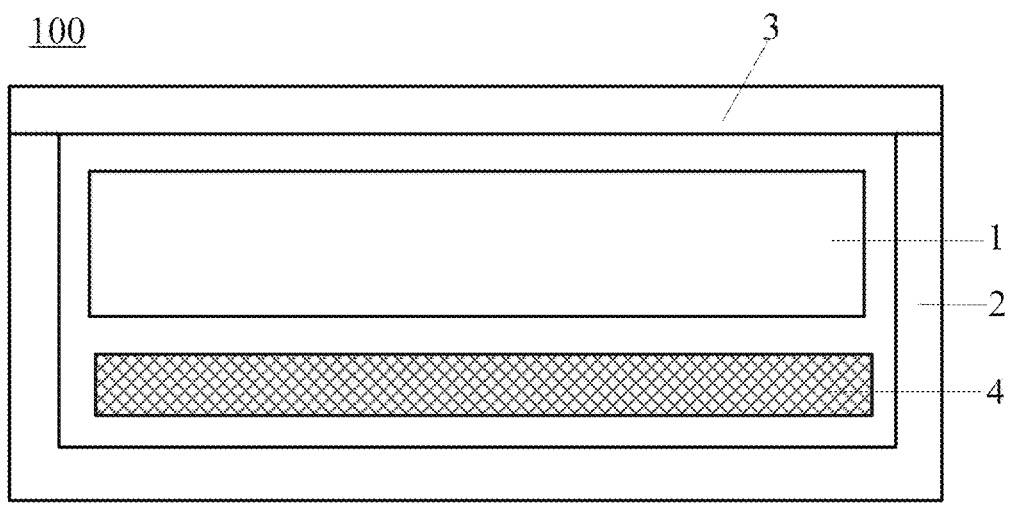
FIG. 1 is a schematic diagram showing a basic structure of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meanings, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first", "second", "third", "fourth", "fifth", "sixth", "seventh" and "eighth" are only used for descriptive purposes, and are not to be construed as indicating or implying the relative importance or implicitly indicating the number of indicated technical features. Thus, features defined by "first", "second", "third", "fourth", "fifth", "sixth", "seventh" or "eighth" may explicitly or implicitly include one or more of the features. In the description of the embodiments of the present disclosure, the term "a plurality of/the plurality of" means two or more unless otherwise specified.

In the description of some embodiments, the terms "connected" and "electrically connected" and their derivatives may be used. For example, the term "connected" may be used in the description of some embodiments to indicate that two or more components are in direct physical or electrical contact with each other. For another example, the term "electrically connected" may be used in the description of some embodiments to indicate that two or more components are in direct electrical contact. However, the term "electrically connected" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shape with respect to the accompanying drawings due to, for example, manufacturing technologies and/or tolerances may be envisaged. Therefore, the exemplary embodiments should not be construed to be limited to the shapes of the regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in an apparatus, and are not intended to limit the scope of the exemplary embodiments.

As shown in FIG. 1, some embodiments of the present disclosure provide a display apparatus 100, a type of which is not limited. It may be a liquid crystal display (abbreviated as LCD) apparatus, or may be an electroluminescent display apparatus or a display apparatus of any other type. The electroluminescent display apparatus may be an organic light-emitting diode (OLED) display apparatus or a quantum dot light-emitting diode (QLED) display apparatus.

As shown in FIG. 1, in some embodiments, the display apparatus 100 includes a display panel 1, a frame 2, a cover glass 3, a circuit board 4 and other electronic accessories. In a case where the display apparatus 100 is the liquid crystal display apparatus, the display apparatus 100 further includes a backlight assembly, which is configured to provide light required to display an image to the display panel 1. The backlight assembly is not shown in FIG. 1.

A longitudinal section of the frame 2 is U-shaped. The cover glass 3 is disposed on an opening side of the frame 2. The display panel 1, the circuit board 4 and other electronic accessories are all arranged in the frame 2. The circuit board 4 is disposed on a side of the display panel 1 away from the cover glass 3. In a case where the display apparatus 100 includes the backlight assembly, the backlight assembly is located between the display panel 1 and the circuit board 4.

Figure 2A:
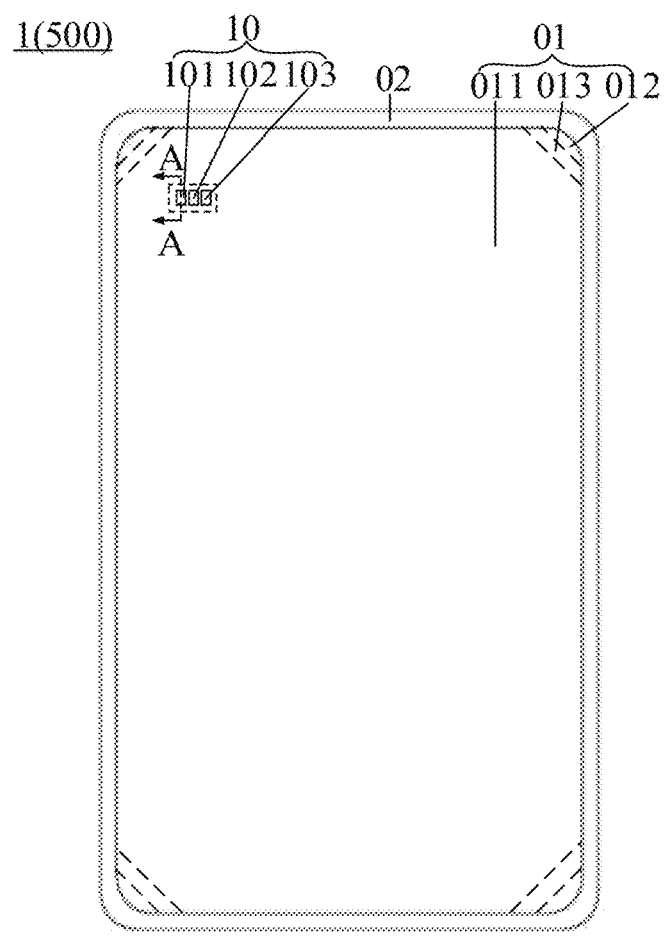
FIG. 2A is a schematic diagram showing a region division of a display panel, in accordance with some embodiments.
Figure 2B:
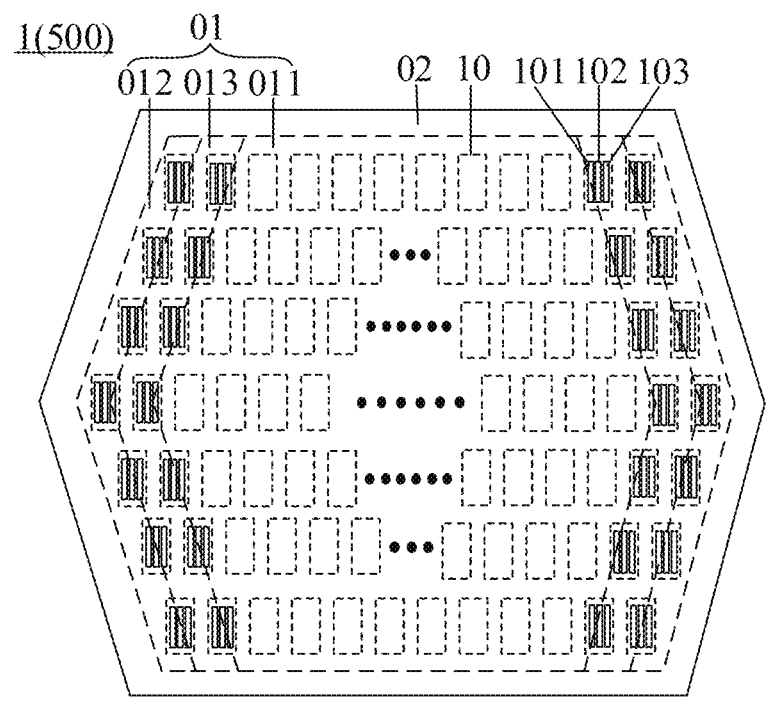
FIG. 2B is a schematic diagram showing a region division of another display panel, in accordance with some embodiments.

As shown in FIGS. 2A and 2B, the display panel 1 has a display region 01 and a peripheral region 02 located on at least one side of the display region 01. FIGS. 2A and 2B show an example in which the peripheral region 02 surrounds the display region 01. The peripheral region 02 is configured to arrange various signal lines required to display an image therein. In addition, the peripheral region 02 may also be configured to arrange a gate driver circuit that outputs scanning signals to sub-pixels of the display panel 1 therein. As shown in FIG. 2A or 2B, the display region 01 is provided with a plurality of pixels 10, and each pixel 10 includes at least three sub-pixels (101, 102 and 103 in FIGS. 2A and 2B). In some embodiments, as shown in FIGS. 2A and 2B, each pixel 10 includes a red sub-pixel 101, a green sub-pixel 102 and a blue sub-pixel 103.

The display panel 1 is a special-shaped display panel. For example, the display panel 1 has an R-shaped (i.e., circular arc-shaped) chamfer (as shown in FIG. 2A). For another example, the display panel 1 has a non-rectangular shape as a whole (as shown in FIG. 2B, the display panel 1 having a hexagonal shape as a whole). In this case, as shown in FIGS. 2A and 2B, the display region 01 of the display panel 1 includes a main display region 011 and edge display region(s) 012 located at a periphery of the main display region 011. Referring to FIGS. 2A and 2B, the display region 01 has a non-rectangular shape, such as a circular shape, an annular shape, a rhombic shape, a hexagonal shape or any other irregular shape.

In addition, in the case where the display apparatus 100 is the electroluminescent display apparatus, the display panel 1 is an electroluminescent display panel. In the case where the display apparatus 100 is the liquid crystal display apparatus, the display panel 1 is a liquid crystal display panel. In order to facilitate understanding of the embodiments of the present disclosure, a structure of the display panel 1 will be exemplarily introduced below by taking examples in which the display panel 1 is the liquid crystal display panel and the display panel 1 is the electroluminescent display panel. However, the exemplary introductions below cannot be understood as limitations on the structure of the display panel 1 provided in the present disclosure, and the structure of the display panel 1 provided in the embodiments of the present disclosure is not limited to the following exemplary introductions, and other variations thereof may also be possible.

Figure 3A:
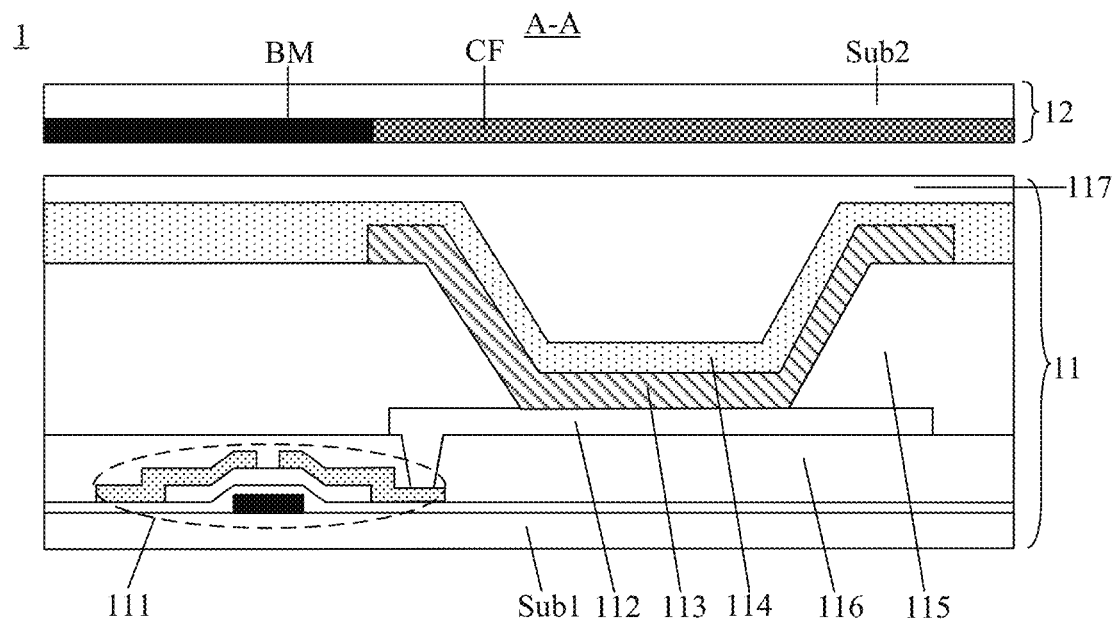
FIG. 3A is a sectional view of the display panel shown in FIG. 2A taken along the line A-A in a case where the display panel is an electroluminescent display panel.
Figure 3B:
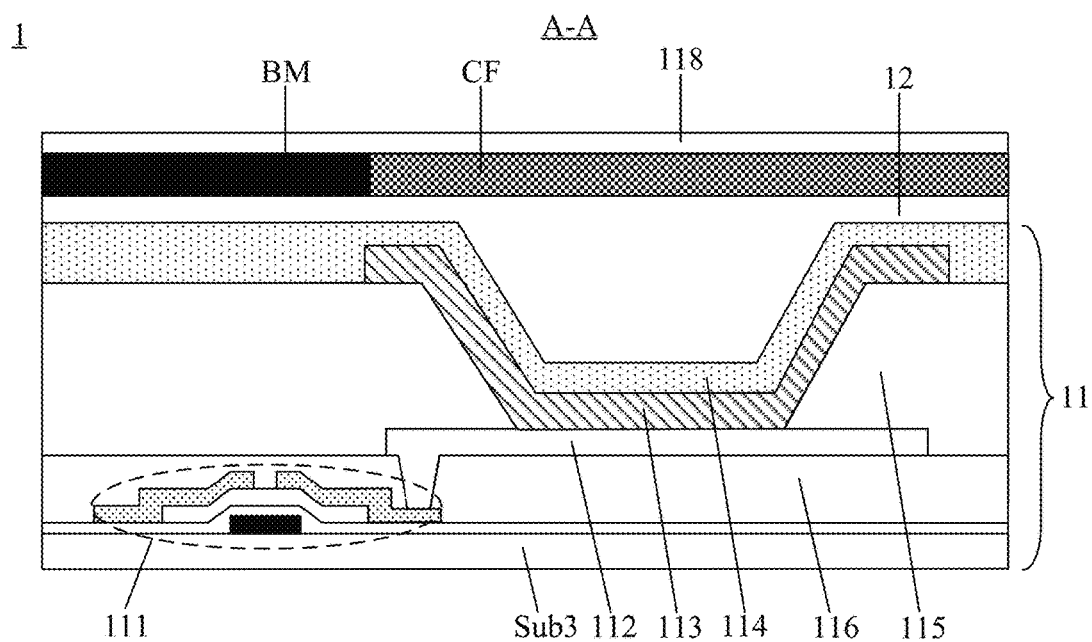
FIG. 3B is another sectional view of the display panel shown in FIG. 2A taken along the line A-A in the case where the display panel is the electroluminescent display panel.

As shown in FIGS. 3A and 3B, the electroluminescent display panel includes a display substrate 11 and an encapsulation layer 12 for encapsulating the display substrate 11.

Here, referring to FIG. 3B, the encapsulation layer 12 may be an encapsulation film; and referring to FIG. 3A, the encapsulation layer 12 may also be an encapsulation substrate.

As shown in FIGS. 3A and 3B, the display substrate 11 includes a light-emitting device and a pixel driving circuit that are disposed on a base (the base being a first base Sub1 in FIG. 3A, and a third base Sub3 in FIG. 3B) and in each sub-pixel, and the pixel driving circuit includes a plurality of thin film transistors 111. A thin film transistor 111 includes an active layer, a source, a drain, a gate and a gate insulating layer. The source and the drain are in contact with the active layer. The light-emitting device includes an anode 112, a light-emitting functional layer 113, and a cathode 114. The anode 112 is electrically connected to a source or a drain of a thin film transistor 111 serving as a driving transistor in the plurality of thin film transistors 111. FIGS. 3A and 3B illustrate that the anode 112 is electrically connected to the drain of the thin film transistor 111.

The display substrate 11 further includes a pixel defining layer 115. The pixel defining layer 115 includes a plurality of openings, and the light-emitting device is disposed in one opening.

In some embodiments, the light-emitting functional layer 113 includes only a light-emitting layer. In some other embodiments, in addition to the light-emitting layer, the light-emitting functional layer 113 further includes at least one of an electron transport layer (abbreviated as ETL), an electron injection layer (abbreviated as EIL), a hole transport layer (abbreviated as HTL), and a hole injection layer (abbreviated as HIL).

As shown in FIGS. 3A and 3B, the display substrate 11 further includes a planarization layer 116 provided between the thin film transistor 111 and the anode 112.

As shown in FIG. 3A, in a case where the encapsulation layer 12 of the display panel 1 is the encapsulation substrate, the display substrate 11 further includes a first protective layer 117 covering a surface of the cathode 114 of the light-emitting device away from the first base Sub1. The encapsulation layer 12 in a form of the encapsulation substrate includes a second base Sub2. The encapsulation layer 12 may further include a black matrix pattern BM. The black matrix pattern BM is used to separate light emitted by different sub-pixels, and has a function of reducing reflected light generated after external ambient light enters the display panel 1. That is to say, the thin film transistor 111 and the black matrix pattern BM are disposed on different bases, i.e., disposed on the first base Sub1 and the second base Sub2, respectively.

In addition, the encapsulation layer 12 may further include a color filter layer CF located in openings formed by the black matrix pattern BM.

As shown in FIG. 3B, in a case where the encapsulation layer 12 of the display panel 1 is the encapsulation film, the encapsulation film covers a surface of the display substrate 11. The display panel 1 may further include a black matrix pattern BM disposed on a side of the encapsulation film away from the display substrate 11. That is to say, the thin film transistor 111 and the black matrix pattern BM are disposed on the same base, i.e., disposed on the third base Sub3.

In addition, the display panel 1 may further include a color filter layer CF located in the openings formed by the black matrix pattern BM. The display panel 1 may further include a second protective layer 118 covering surfaces of the black matrix pattern BM and the color filter layer CF away from the display substrate 11.

Figure 4A:
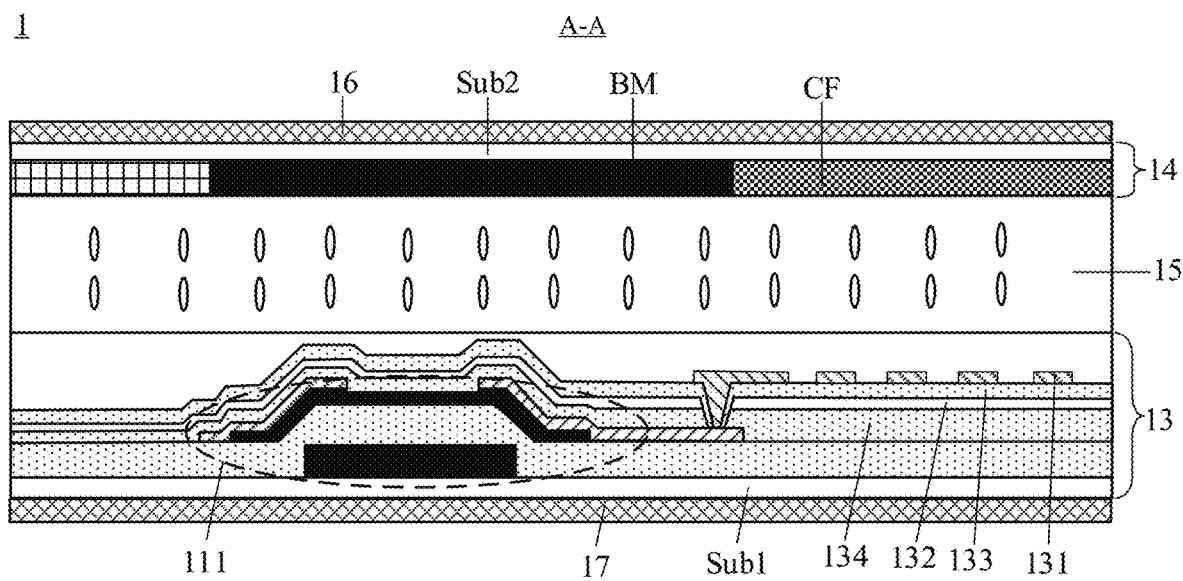
FIG. 4A is a sectional view of the display panel shown in FIG. 2A taken along the line A-A in a case where the display panel shown is a liquid crystal display panel.
Figure 4B:
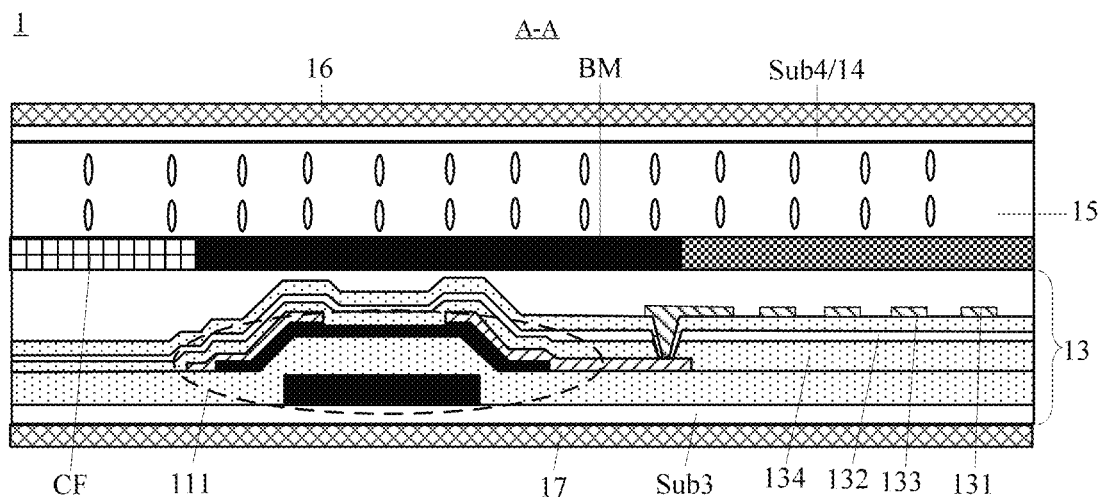
FIG. 4B is another sectional view of the display panel shown in FIG. 2A taken along the line A-A in the case where the display panel is the liquid crystal display panel.

As shown in FIGS. 4A and 4B, the liquid crystal display panel includes an array substrate 13 and an opposite substrate 14 that are disposed opposite to each other, and a liquid crystal layer 15 disposed between the array substrate 13 and the opposite substrate 14.

The array substrate 13 includes a thin film transistor 111 and a pixel electrode 131 that are disposed on a base (the base being the first base Sub1 in FIG. 4A, and the third base Sub3 in FIG. 4B) and in each sub-pixel. The pixel electrode 131 is electrically connected to a source or a drain of the thin film transistor 111. FIGS. 4A and 4B illustrate that the pixel electrode 131 is electrically connected to the drain of the thin film transistor 111.

In some embodiments, the array substrate 13 further includes common electrode(s) 132 disposed on the base (the first base Sub1 or the third base Sub3) and in the plurality of pixels 10. The pixel electrode 131 and the common electrode 132 may be disposed in a same layer. In this case, the pixel electrode 131 and the common electrode 132 are each of a comb-tooth structure including a plurality of strip-shaped sub-electrodes. The pixel electrode 131 and the common electrode 132 may also be disposed in different layers. In this case, as shown in FIGS. 4A and 4B, a first insulating layer 133 is provided between the pixel electrode 131 and the common electrode 132. In a case where the common electrode 132 is disposed between the thin film transistor 111 and the pixel electrode 131, as shown in FIGS. 4A and 4B, a second insulating layer 134 is provided between the common electrode 132 and the thin film transistor 111.

In some other embodiments, the common electrode 132 is disposed in the opposite substrate 14.

The opposite substrate 14 includes a base, which is the second base Sub2 in FIG. 4A, and a fourth base Sub4 in FIG. 4B.

As shown in FIGS. 4A and 4B, the liquid crystal display panel further includes a color filter layer CF and a black matrix pattern BM. The color filter layer CF includes at least red photoresist patterns disposed in the red sub-pixels 101, green photoresist patterns disposed in the green sub-pixels 102, and blue photoresist patterns disposed in the blue sub-pixels 103. The black matrix pattern BM is used to separate the light emitted by different sub-pixels, and has the function of reducing the reflected light generated after the external ambient light enters the display panel 1.

As shown in FIG. 4A, the color filter layer CF and the black matrix pattern BM may be disposed on the second base Sub2 of the opposite substrate 14. That is, the opposite substrate 14 includes the color filter layer CF and the black matrix pattern BM. In this case, the thin film transistor 111 and the black matrix pattern BM are disposed on different bases, i.e., disposed on the first base Sub1 and the second base Sub2, respectively.

As shown in FIG. 4B, the color filter layer CF and the black matrix pattern BM may be disposed on the third base Sub3 of the array substrate 13. That is, the array substrate 13 includes the color filter layer CF and the black matrix pattern BM. In this case, the liquid crystal display panel adopts a color filter on array (COA) technology. The thin film transistor 111 and the black matrix pattern BM are disposed on the same base, i.e., the third base Sub3.

As shown in FIGS. 4A and 4B, the liquid crystal display panel further includes an upper polarizer 16 disposed on a side of the opposite substrate 14 away from the liquid crystal layer 15, and a lower polarizer 17 disposed on a side of the array substrate 13 away from the liquid crystal layer 15.

As shown in FIGS. 2A and 2B, when the special-shaped display apparatus 100 is displaying an image, an edge of the display region 01 may be jagged, which affects a display effect.

In an implementation, pixels per inch (PPI) of the edge display region 012 are increased (that is, the number of sub-pixels in the edge display region 012 is increased), and along a direction from the main display region 011 to the edge display region 012, sizes of sub-pixels located at a junction of the main display region 011 and the edge display region 012 are made to gradually decrease.

However, since sizes of the sub-pixels along a direction from the main display region 011 to the edge display region 012 gradually decrease and distances between the sub-pixels change, when manufacturing red photoresist patterns, green photoresist patterns and blue photoresist patterns in the color filter layer CF, the red photoresist patterns, the green photoresist patterns and the blue photoresist patterns are in different sizes, and a distance between two adjacent red photoresist patterns, a distance between two adjacent green photoresist patterns, and a distance between two adjacent blue photoresist patterns are different. As a result, one mask cannot be shared when manufacturing the red photoresist patterns, the green photoresist patterns, and the blue photoresist patterns, which leads to an increase in manufacturing costs.

Figure 9A:
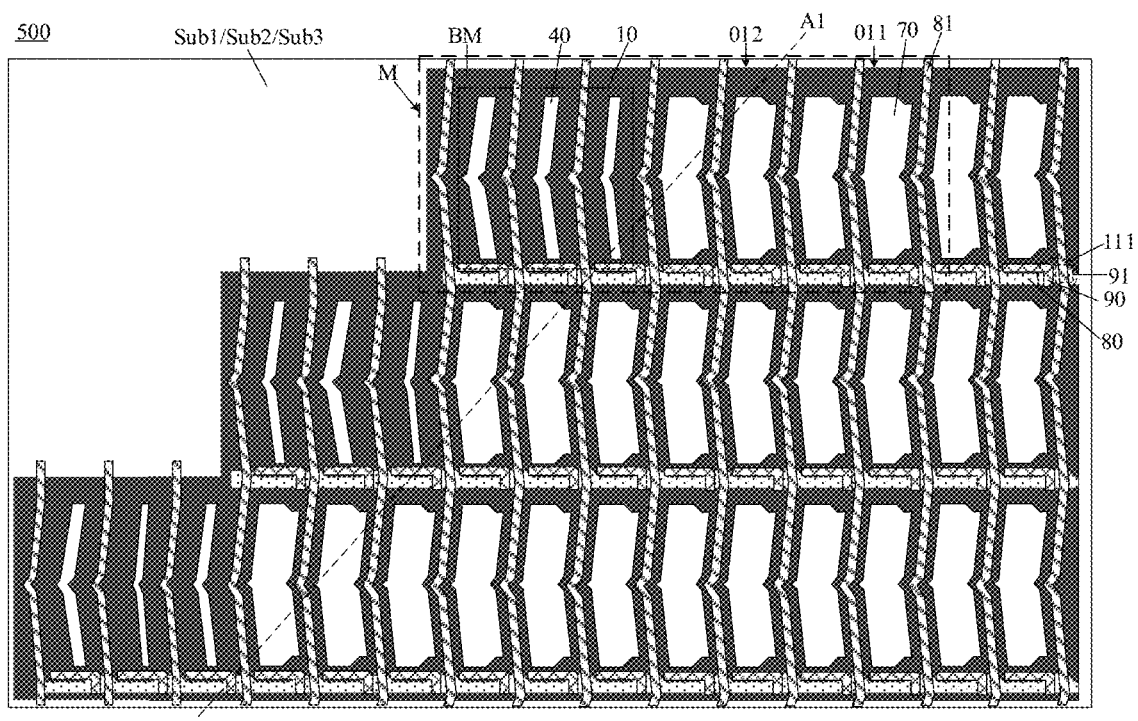
FIG. 9A is a schematic diagram of a part of a display apparatus substrate, in accordance with some embodiments.
Figure 9B:
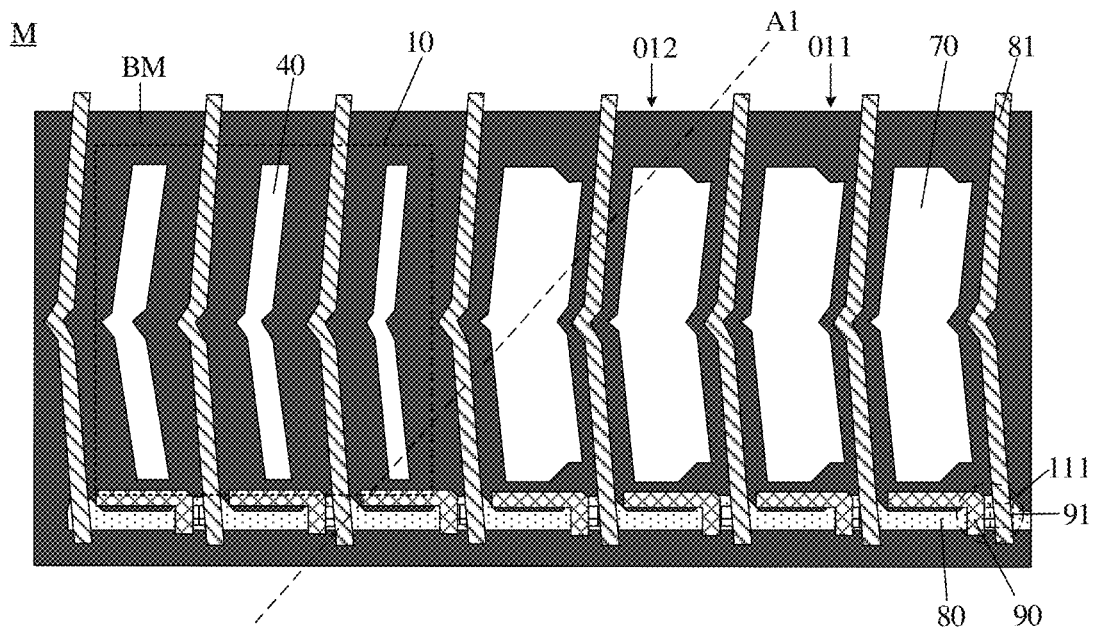
FIG. 9B is a local enlarged schematic diagram of the portion M in FIG. 9A.

In some embodiments, as shown in FIGS. 9A and 9B, when the black matrix pattern BM is designed, a portion of the black matrix pattern BM located in the edge display region 012 includes a plurality of slits 40, and each sub-pixel in a pixel 10 located in the edge display region 012 is provided with one slit 40. Light may pass through the slit 40, and a size of the slit 40 determines a magnitude of an aperture ratio of the sub-pixel. Relative to that each sub-pixel in the pixel 10 located in the edge display region 012 is provided with no slit 40, which causes that no light passes through each sub-pixel in the pixel 10 located in the edge display region 012 (that is, a gray scale of each sub-pixel in the pixel 10 located in the edge display region 012 is zero), in the above embodiments, since light may pass through sub-pixels located in the main display region 011 as well as the sub-pixels in the edge display region 012, a difference between a gray scale of the sub-pixel located in the main display region 011 and the gray scale of the sub-pixel located in the edge display region 012 may be reduced, thereby reducing a jagged phenomenon.

However, since the black matrix pattern BM has poor manufacturing accuracy and alignment accuracy, there may be a difference in sizes of slits 40 disposed in different sub-pixels in a same pixel 10, thereby resulting in different aperture ratios of different sub-pixels in the same pixel 10 located in the edge display region 012. In a case where a red sub-pixel 101, a green sub-pixel 102 and a blue sub-pixel 103 in a pixel 10 have the same aperture ratio, when the display apparatus 100 displays a white image, the pixel 10 displays a white color. In a case where the red sub-pixel 101, the green sub-pixel 102, and the blue sub-pixel 103 in the pixel 10 have different aperture ratios, when the display apparatus 100 displays the white image, there is a color cast in the white color displayed by the pixel 10. For example, if the aperture ratio of the red sub-pixel 101 is larger than the aperture ratios of the green sub-pixel 102 and the blue sub-pixel 103 in the pixel 10, when the display apparatus 100 displays the white image, the pixel 10 displays a reddish color.

Based on this, although the solution in the above embodiments may reduce the jagged phenomenon at the edge of the display region 01 during the display of the special-shaped display apparatus 100, the aperture ratios of different sub-pixels in the same pixel 10 located in the edge display region 012 are different, and it may be possible to cause the color cast phenomenon. In addition, since the black matrix pattern BM has the poor manufacturing accuracy and alignment accuracy, there may be a deviation between the aperture ratio of each sub-pixel in the pixel 10 located in the edge display region 012 and a preset value, thereby resulting in an unsatisfying improvement of the jagged phenomenon.

Figure 5A:
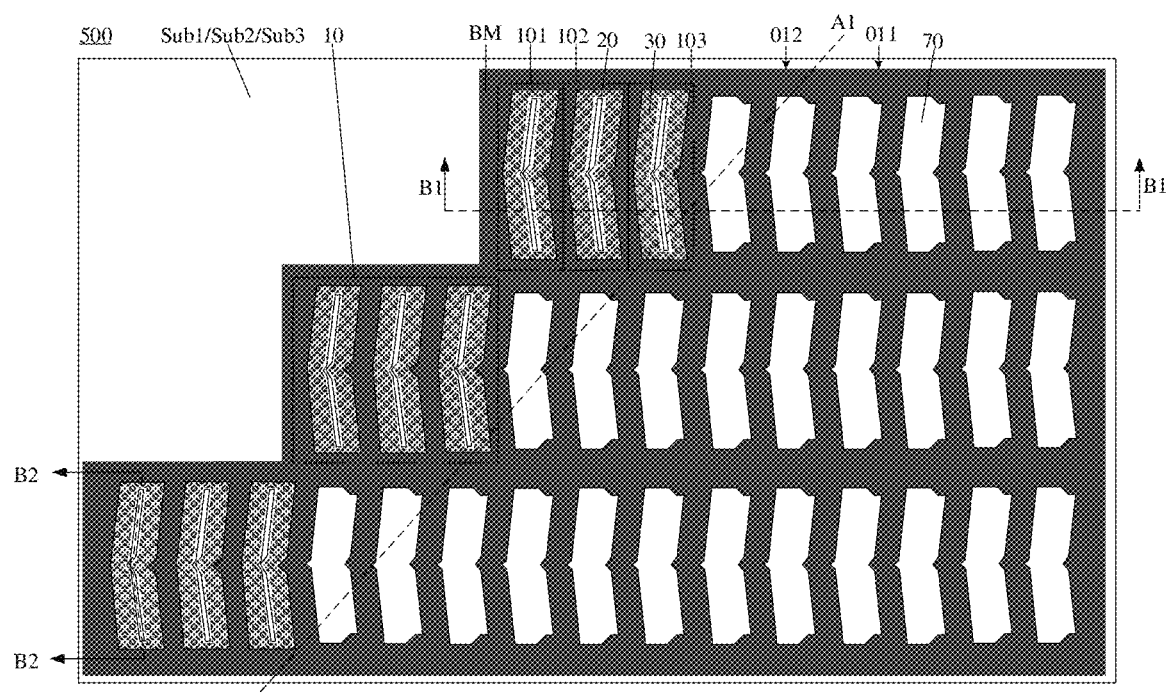
FIG. 5A is a top view of a part of a display apparatus substrate, in accordance with some embodiments.

Referring to FIG. 5A, the embodiments of the present disclosure further provide a display apparatus substrate 500, which may be applied to the above display apparatus 100. In the case where the display apparatus 100 is the liquid crystal display apparatus, referring to FIGS. 4A and 4B, the display apparatus substrate 500 provided in the embodiments of the present disclosure may be the liquid crystal display panel, or may be the array substrate 13 or the opposite substrate 14 in the liquid crystal display panel. In the case where the display apparatus 100 is the electroluminescent display apparatus, referring to FIGS. 3A and 3B, the display apparatus substrate 500 provided in the embodiments of the present disclosure may be the electroluminescent display panel, or may be the display substrate 11 or the encapsulation substrate in the electroluminescent display panel.

As shown in FIGS. 2A and 2B, the display apparatus substrate 500 provided in the embodiments of the present disclosure has the non-rectangular display region 01. The display region 01 includes the main display region 011 and the edge display region(s) 012 located at the periphery of the main display region 011. Referring to FIG. 5A, the display apparatus substrate 500 includes the black matrix pattern BM and a plurality of first metal patterns 30.

The plurality of pixels 10 are disposed in the display region 01. Each pixel 10 includes the at least three sub-pixels (101, 102 and 103 in FIG. 5A). A portion of the black matrix pattern BM located in the edge display region(s) 012 has a plurality of first openings 20. A first opening 20 is disposed in one corresponding sub-pixel in the edge display region(s) 012. The plurality of first metal patterns 30 are disposed in the edge display region(s) 012, and a first metal pattern 30 corresponds to one first opening 20 and disposed in the corresponding sub-pixel; and an orthogonal projection of the first metal pattern 30 on a reference plane overlaps a partial region of an orthogonal projection of the corresponding first opening 20 on the reference plane. The reference plane is a plane determined by the display apparatus substrate 500. For example, the reference plane may be a surface, close to or far away from the black matrix pattern BM, of the base (Sub1, Sub2 or Sub3 in FIG. 5A) of the display apparatus substrate 500.

The dashed line A1 in the figures (e.g., FIG. 5A) of the embodiments of the present disclosure represents a first boundary line A1. A region on a left of the first boundary line A1 represents the edge display region 012, and a region on a right thereof represents the main display region 011.

It will be noted that, for a pixel 10 that is partially located in the edge display region 012 and partially located in the main display region 011, if an area of the portion of the pixel 10 located in the edge display region 012 is one half (½) of an area of the pixel 10 or greater than ½ of the area of the pixel 10, the pixel 10 is considered to be a pixel 10 located in the edge display region 012; and if an area of the portion of the pixel 10 located in the main display region 011 is greater than ½ of the area of the pixel 10, the pixel 10 is considered to be a pixel 10 located in the main display region 011.

In some embodiments, the black matrix pattern BM is made of an organic material, such as resin.

Herein, a material of the first metal pattern 30 is not limited, and may be at least one of a simple metal, an alloy, or a metal oxide. The simple metal may be, for example, at least one of copper (Cu), aluminum (Al), or silver (Ag).

A person skilled in the art will understand that, the black matrix pattern BM is able to block the light. Since one first opening 20 is provided in each sub-pixel in the pixel 10 located in the edge display region 012, the light may pass through the first opening 20. In addition, since the orthogonal projection of the first metal pattern 30 on the reference plane overlaps the partial region of the orthogonal projection of the first opening 20 on the reference plane, and the first metal pattern 30 is also able to block the light, an area of a portion, through which light is actually able to pass, of each sub-pixel is a difference of an area of the first opening 20 and an area of a portion of the first opening 20 covered by the first metal pattern 30. Therefore, a magnitude of the area of the first opening 20 disposed in each sub-pixel located in the edge display region 012 and a magnitude of the area of the portion of the first opening 20 covered by the first metal pattern 30 determine the magnitude of the aperture ratio of the sub-pixel in the edge display region 012, i.e., determining a light transmittance of the sub-pixel located in the edge display region 012.

Based on this, the magnitude of the area of the first opening 20 in the sub-pixel located in the edge display region 012 and the magnitude of the area of the portion of the first opening 20 covered by the first metal pattern 30 may be designed according to a required magnitude of the aperture ratio of each sub-pixel in the pixel 10 located in the edge display region 012.

It can be seen from the above that, in the display apparatus substrate 500 provided in the embodiments of the present disclosure, one first opening 20 is provided in each sub-pixel in the pixel 10 located in the edge display region 012, and the light may pass through a portion of the first opening 20 that is not covered by the first metal pattern 30, so that the light passes through each sub-pixel in the pixel 10 located in the edge display region 012. As a result, relative to that no first opening 20 is provided in each sub-pixel in the pixel 10 located in the edge display region 012, the embodiments of the present disclosure can reduce the difference between the gray scale of the sub-pixel located in the main display region 011 and the gray scale of the sub-pixel located in the edge display region 012 at the first boundary line A1, so that the jagged phenomenon existing in the display region 01 may be reduced.

It will be understood that, since a manufacturing accuracy of metal is higher than the manufacturing accuracy of the black matrix pattern BM, a manufacturing accuracy of the first metal pattern 30 is higher than the manufacturing accuracy of the black matrix pattern BM.

Based on this, since the manufacturing accuracy of the first metal pattern 30 is higher than that of the black matrix pattern BM, the accurate manufacturing of the first metal pattern 30 may compensate for a large manufacturing deviation of the black matrix pattern BM. Therefore, the aperture ratio of the sub-pixel may be accurately adjusted by adjusting the area of a portion of the orthogonal projection of the first opening 20 on the reference plane that is overlapped with the orthogonal projection of the first metal pattern 30 on the reference plane, and in turn, the deviation between the aperture ratio of the sub-pixel and the preset value is reduced, and the aperture ratios of the sub-pixels in the same pixel 10 are the same or substantially the same. As a result, it may be possible to reduce the color cast phenomenon caused by the different aperture ratios of the sub-pixels in the same pixel 10, and to improve the display effect of the display apparatus 100.

Based on the above, a person skilled in the art will understand that, when the display apparatus substrate 500 is manufactured, the area of the first opening 20 may be set large first, and then the aperture ratio of the sub-pixel is adjusted by adjusting the area of the portion of the orthogonal projection of the first opening 20 on the reference plane that is overlapped with the orthogonal projection of the first metal pattern 30 on the reference plane, so as to make the aperture ratio of the sub-pixel the same as or close to the preset value.

In some embodiments, in the edge display region 012, areas of portions, which are not covered by first metal patterns 30, of first openings 20 in the sub-pixels that belong to the same pixel 10 are substantially the same. That is to say, the aperture ratios of the sub-pixels that belong to the same pixel 10 in the edge display region 012 are substantially the same.

Here, in a case where the pixel 10 in the edge display region 012 includes the red sub-pixel 101, the green sub-pixel 102 and the blue sub-pixel 103, the aperture ratio of the red sub-pixel 101, the aperture ratio of the green sub-pixel 102, and the aperture ratio of the blue sub-pixel 103 are substantially the same.

Based on this, since the aperture ratios of the sub-pixels in the same pixel 10 in the edge display region 012 are all the same, it may be possible to avoid the color cast phenomenon caused by the different aperture ratios of the sub-pixels in the same pixel 10 in the edge display region 012, and to further improve the display effect of the display apparatus 100.

Figure 5B:
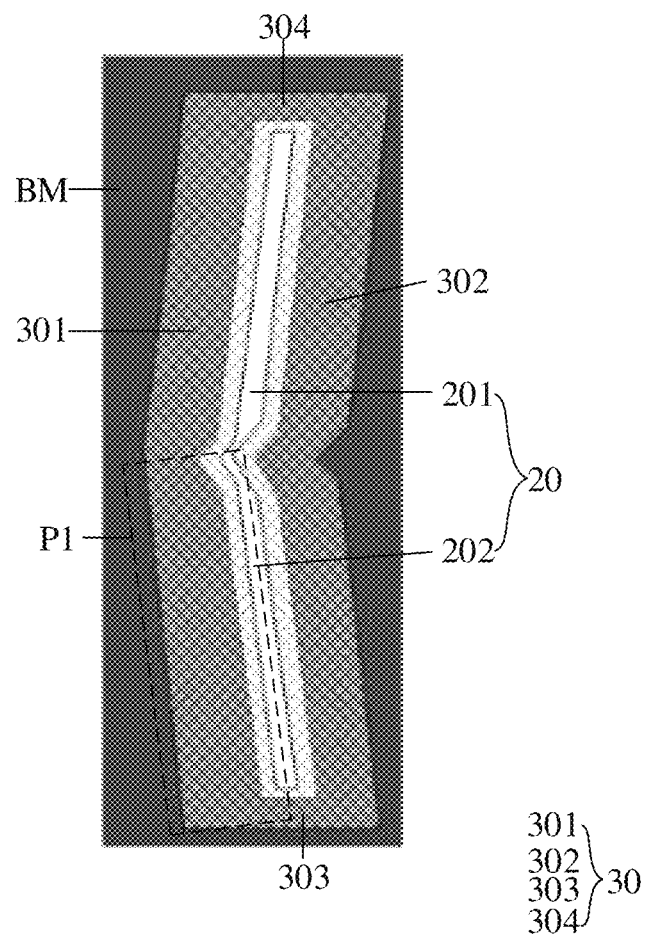
FIG. 5B is an enlarged view of a sub-pixel located in the edge display region in FIG. 5A.
Figure 6A:
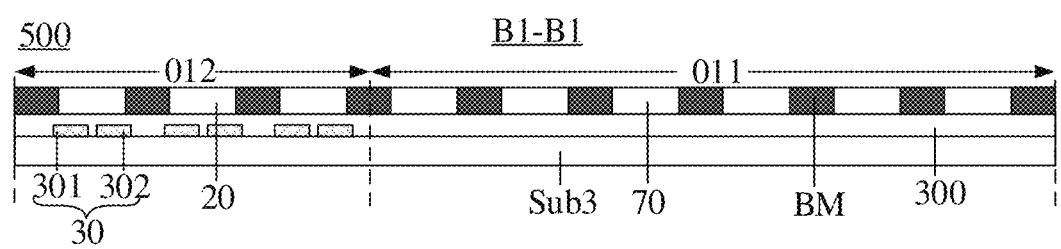
FIG. 6A is a sectional view taken along the line B1-B1 in FIG. 5A.
Figure 6B:
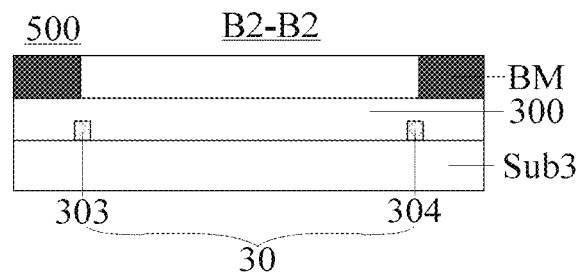
FIG. 6B is a sectional view taken along the line B2-B2 in FIG. 5A.

In some embodiments, referring to FIGS. 5B, 6A and 6B, at least part of a border of the orthogonal projection of the first opening 20 on the reference plane is within the orthogonal projection of the corresponding first metal pattern 30 on the reference plane.

In this way, the large manufacturing deviation of the black matrix pattern BM may be compensated by the accurate manufacturing of the first metal pattern 30, and the aperture ratio of the sub-pixel may be accurately adjusted by adjusting the area of the portion of the orthogonal projection of the first opening 20 on the reference plane that is overlapped with the orthogonal projection of the first metal pattern 30 on the reference plane, so as to reduce the deviation between the aperture ratio of the sub-pixel and the preset value, and to make the aperture ratios of the sub-pixels in the same pixel 10 the same or substantially the same. As a result, it may be possible to reduce the color cast phenomenon caused by the different aperture ratios of the sub-pixels in the same pixel 10, and to improve the display effect of the display apparatus 100.

A shape of the first opening 20 is not limited. In some embodiments, as shown in FIG. 5A or 8A, the first opening 20 is strip-shaped.

For example, the first opening 20 may be straight-strip-shaped. That is, an orthogonal projection of the strip-shaped first opening 20 on the reference plane substantially has a rectangular shape. Or, the strip-shaped first opening 20 may include a first strip-shaped opening 201 and a second strip-shaped opening 202, and an angle between the first strip-shaped opening 201 and the second strip-shaped opening 202 is an obtuse angle. FIGS. 5B and FIG. 8B show an example in which the strip-shaped first opening 20 includes the first strip-shaped opening 201 and the second strip-shaped opening 202.

Figure 8A:
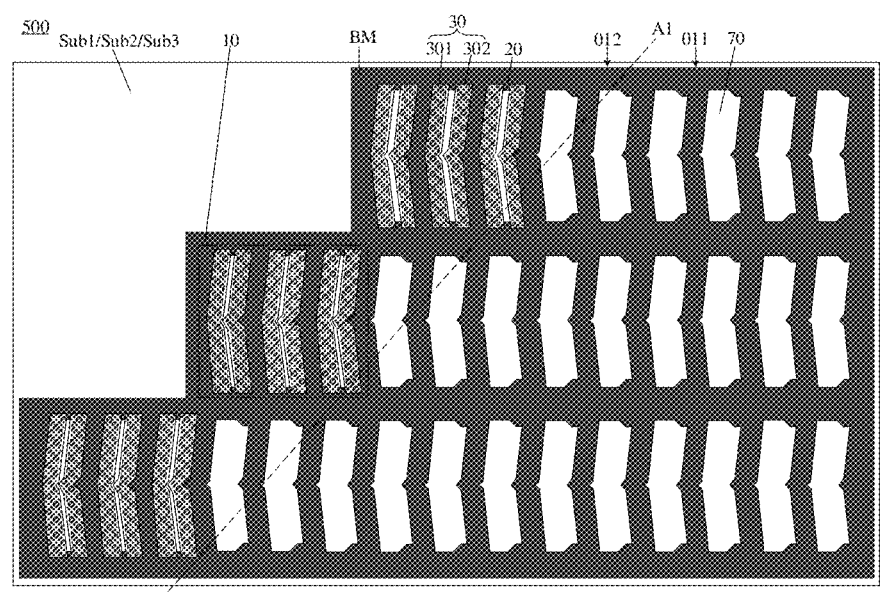
FIG. 8A is a top view of a part of another display apparatus substrate, in accordance with some embodiments.
Figure 8B:
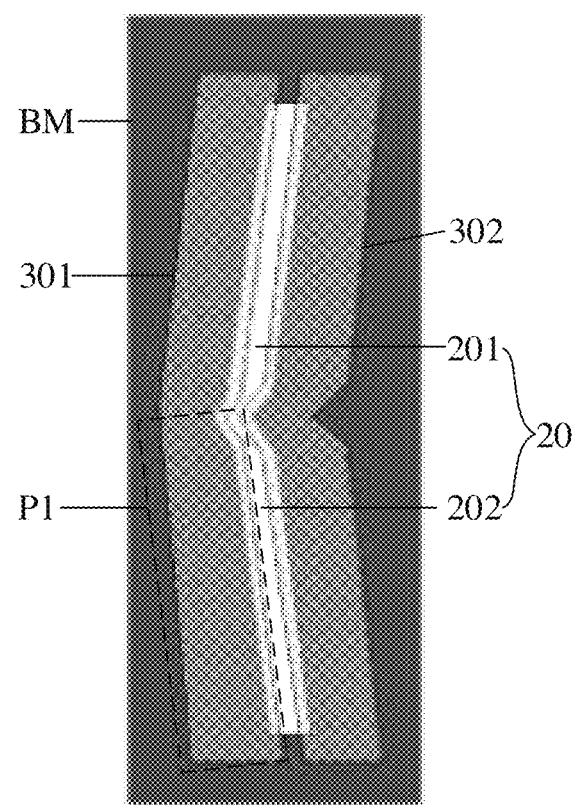

In some embodiments, as shown in FIGS. 8A and 8B, the first opening 20 is strip-shaped, and the orthogonal projection of the first opening 20 on the reference plane has two opposite long sides. The two opposite long sides of the orthogonal projection of the first opening 20 on the reference plane are within the orthogonal projection of the corresponding first metal pattern 30 on the reference plane.

For example, as shown in FIGS. 5A, 5B, 8A and 8B, the first metal pattern 30 includes a first metal strip 301 and a second metal strip 302; extension directions of the first metal strip 301 and the second metal strip 302 are substantially the same as an extension direction of the first opening 20; and the two opposite long sides of the orthogonal projection of the first opening 20 on the reference plane are within orthogonal projections of the first metal strip 301 and the second metal strip 302 on the reference plane.

Here, a shape of the first metal strip 301 and a shape of the second metal strip 302 are the same as the shape of the first opening 20, which facilitates adjustment of an area of a portion of the first opening 20 that is covered by the first metal strip 301 and the second metal strip 302. For example, referring to FIGS. 5B and 8B, in a case where the first opening 20 includes the first strip-shaped opening 201 and the second strip-shaped opening 202, and the angle between the first strip-shaped opening 201 and the second strip-shaped opening 202 is the obtuse angle; and the shape of the first metal strip 301 and the shape of the second metal strip 302 are substantially the same as the shape of the first opening 20. That is, the first metal strip 301 and the second metal strip 302 each include two first metal sub-strips P1 connected to each other, and an angle between the two first metal sub-strips P1 is also an obtuse angle.

Based on this, as shown in FIGS. 5A and 5B, the first metal pattern 30 further includes a third metal strip 303 and a fourth metal strip 304. The first metal strip 301, the second metal strip 302, the third metal strip 303, and the fourth metal strip 304 are connected to form a frame shape. The orthogonal projection of the first opening 20 on the reference plane has two opposite short sides, and the two opposite short sides of the orthogonal projection of the first opening 20 on the reference plane are within orthogonal projections of the third metal strip 303 and the fourth metal strip 304 on the reference plane.

In this way, the aperture ratio of each sub-pixel located in the edge display region 012 is determined only by an opening in the frame shape formed by the first metal pattern 30. Therefore, it is possible to accurately adjust the aperture ratio of the sub-pixel by directly adjusting a size of the opening in the frame shape of the first metal pattern 30, and in turn, the deviation between the aperture ratio of the sub-pixel and the preset value is reduced, and the aperture ratios of the sub-pixels in the same pixel 10 are the same or substantially the same. As a result, it may be possible to further reduce the color cast phenomenon caused by the different aperture ratios of the sub-pixels in the same pixel 10, and to improve the display effect of the display apparatus 100.

Figure 10A:
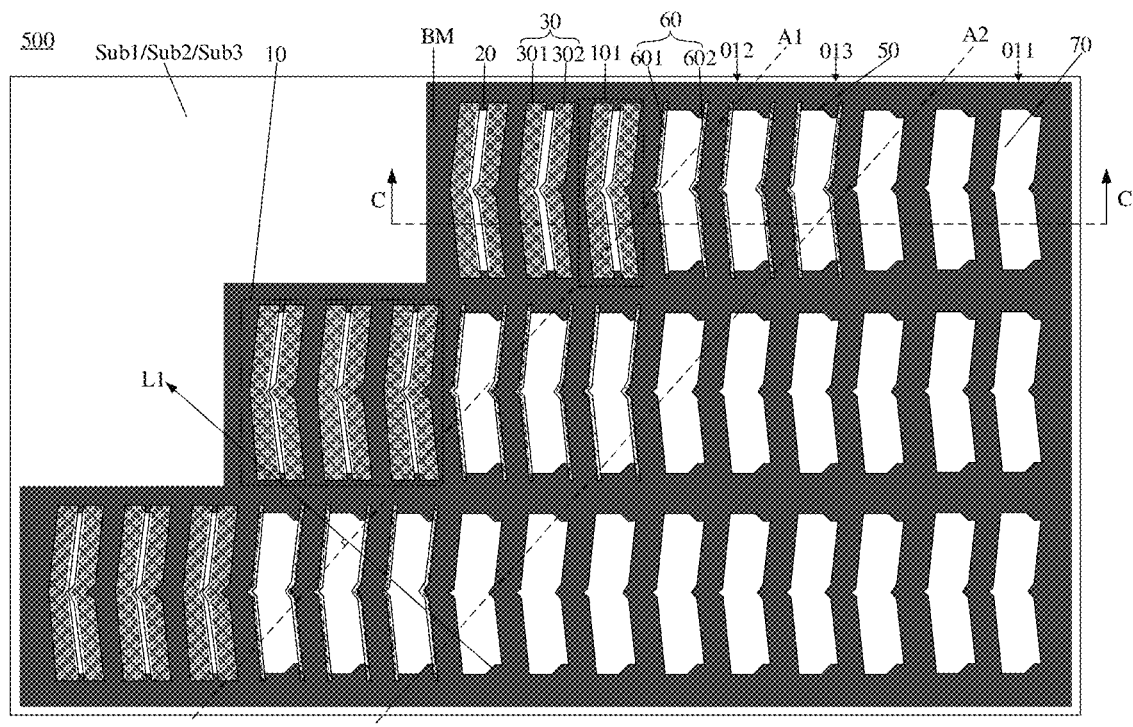
FIG. 10A is a top view of a part of yet another display apparatus substrate, in accordance with some embodiments.

As shown in FIGS. 2A, 2B and 10A, the display region 01 further includes transition display region(s) 013 located between the main display region 011 and the edge display region(s) 012. A portion of the black matrix pattern BM located in the transition display region(s) 013 has a plurality of second openings 50; and a second opening 50 is disposed in one corresponding sub-pixel in the transition display region(s) 013.

In some embodiments, referring to FIGS. 10A, 10B, 11A and 11B, the display apparatus substrate 500 further includes a plurality of second metal patterns 60 disposed in the transition display region(s) 013, and a second metal pattern 60 corresponds to one second opening 50 and disposed in the corresponding sub-pixel. An orthogonal projection of the second metal pattern 60 on the reference plane overlaps a partial region of an orthogonal projection of the corresponding second opening 50 on the reference plane (e.g., the surface of the base Sub1, Sub2, or Sub3).

The dashed line A1 in the figures (e.g., FIG. 10A) of the embodiments of the present disclosure represents the first boundary line A1, the region on the left of the first boundary line A1 represents the edge display region 012. A dashed line A2 in the figures (e.g., FIG. 10A) of the embodiments of the present disclosure represents a second boundary line A2, a region between the second boundary line A2 and the first boundary line A1 represents the transition display region 013, and a region on a right thereof represents the main display region 011.

It will be noted that, for a pixel 10 that is partially located in the edge display region 012 and partially located in the transition display region 013, if an area of the portion of the pixel 10 located in the edge display region 012 is one half (½) of an area of the pixel 10 or greater than ½ of the area of the pixel 10, the pixel 10 is considered to be a pixel 10 located in the edge display region 012; and if an area of the portion of the pixel 10 located in the transition display region 013 is greater than ½ of the area of the pixel 10, the pixel 10 is considered to be a pixel 10 located in the transition display region 013.

Similarly, for a pixel 10 that is partially located in the transition display region 013 and partially located in the main display region 011, if an area of the portion of the pixel 10 located in the transition display region 013 is one half (½) of an area of the pixel 10 or greater than ½ of the area of the pixel 10, the pixel 10 is considered to be a pixel 10 located in the transition display region 013; and if an area of the portion of the pixel 10 located in the main display region 011 is greater than ½ of the area of the pixel 10, the pixel 10 is considered to be a pixel 10 located in the main display region 011.

It will be understood that, for each sub-pixel in the pixel 10 located in the transition display region 013, in a case where no second metal pattern 60 is provided at a second opening 50, a magnitude of an area of the second opening 50 provided in the sub-pixel determines a magnitude of an aperture ratio of the sub-pixel. In a case where the second metal pattern 60 is provided at an edge of the second opening 50, since the second metal pattern 60 may block the light, an area of a portion, through which the light is actually able to pass, of the sub-pixel is a difference of the area of the second opening 50 and an area of a portion of the second opening 50 that is covered by the second metal pattern 60. Therefore, the magnitude of the area of the second opening 50 provided in the sub-pixel and a magnitude of the area of the portion of the second opening 50 that is covered by the second metal pattern 60 determine the magnitude of the aperture ratio of the sub-pixel. Based on this, the aperture ratio of the sub-pixel in the transition display region 013 may be adjusted by adjusting the magnitude of the area of the portion of the second opening 50 that is covered by the second metal pattern 60.

Here, a material of the second metal pattern 60 is not limited, and reference may be made to the material of the first metal pattern 30, and details will not be repeated herein. The material of the second metal pattern 60 and the material of the first metal pattern 30 may be the same or different. In a case where the material of the second metal pattern 60 and the material of the first metal pattern 30 are the same, the first metal pattern 30 and the second metal pattern 60 may be arranged in a same layer. In this way, the first metal pattern 30 and the second metal pattern 60 may be formed simultaneously through a same photolithography process, thereby simplifying a manufacturing process.

In the embodiments of the present disclosure, the transition display region 13 is located between the main display region 011 and the edge display region 012, and in the pixel 10 in the transition display region 13, the second metal pattern 60 is provided at the second opening 50 and may be used for adjusting the aperture ratio of each sub-pixel in the pixel 10 in the transition display region 13. Therefore, by adjusting the aperture ratio of each sub-pixel in the pixel 10 in the transition display region 13, a gray scale difference between the sub-pixel in the main display region 011 and the sub-pixel in the edge display region 012 may be reduced, and in turn, the jagged phenomenon of the display region 01 may be more effectively reduced.

It will be understood that, a manufacturing accuracy of the second metal pattern 60 is higher than the manufacturing accuracy of the black matrix pattern BM.

Based on this, since the manufacturing accuracy of the second metal pattern 60 is higher than the manufacturing accuracy of the black matrix pattern BM, the accurate manufacturing of the second metal pattern 60 may compensate for the large manufacturing deviation of the black matrix pattern BM. Therefore, the aperture ratio of the sub-pixel may be accurately adjusted by adjusting an area of a portion of the orthogonal projection of the second opening 50 on the reference plane that is overlapped with the orthogonal projection of the second metal pattern 60 on the reference plane. As a result, a deviation between the aperture ratio of the sub-pixel and the preset value is reduced.

Based on the above, a person skilled in the art will understand that, when the display apparatus substrate 500 is manufactured, the area of the second opening 50 may be set large first, and then the aperture ratio of the sub-pixel is adjusted by adjusting the area of the portion of the orthogonal projection of the second opening 50 on the reference plane that is overlapped with the orthogonal projection of the second metal pattern 60 on the reference plane, so as to make the aperture ratio of the sub-pixel the same as or close to the preset value.

In some embodiments, in the transition display region 013, areas of portions, which are not blocked by second metal patterns 60, of second openings 50 in sub-pixels that belong to a same pixel 10 are substantially the same. That is to say, aperture ratios of the sub-pixels that belong to the same pixel 10 in the transition display region 013 are substantially the same.

Here, in a case where the pixel 10 in the transition display region 013 includes the red sub-pixel 101, the green sub-pixel 102 and the blue sub-pixel 103, the aperture ratio of the red sub-pixel 101, the aperture ratio of the green sub-pixel 102, and the aperture ratio of the blue sub-pixel 103 are substantially the same.

Based on this, since the aperture ratios of the sub-pixels in the same pixel 10 in the transition display region 013 are all the same, it may be possible to avoid the color cast phenomenon caused by different aperture ratios of the sub-pixels in the same pixel 10 in the transition display region 013, and to further improve the display effect of the display apparatus 100.

In the embodiments of the present disclosure, in a case where aperture ratios of sub-pixels in a same pixel 10 located in the main display region 011, the aperture ratios of sub-pixels in the same pixel 10 located in the transition display region 013, and the aperture ratios of sub-pixels in the same pixel 10 located in the edge display region 012 are all the same, the photo resist patterns in the sub-pixels of different colors may be formed by using a same mask. For example, the red photoresist patterns in the red sub-pixels 101, the blue photoresist patterns in the blue sub-pixels 103, and the green photoresist patterns in the green sub-pixels 102 may be formed by using the same mask.

Figure 10B:
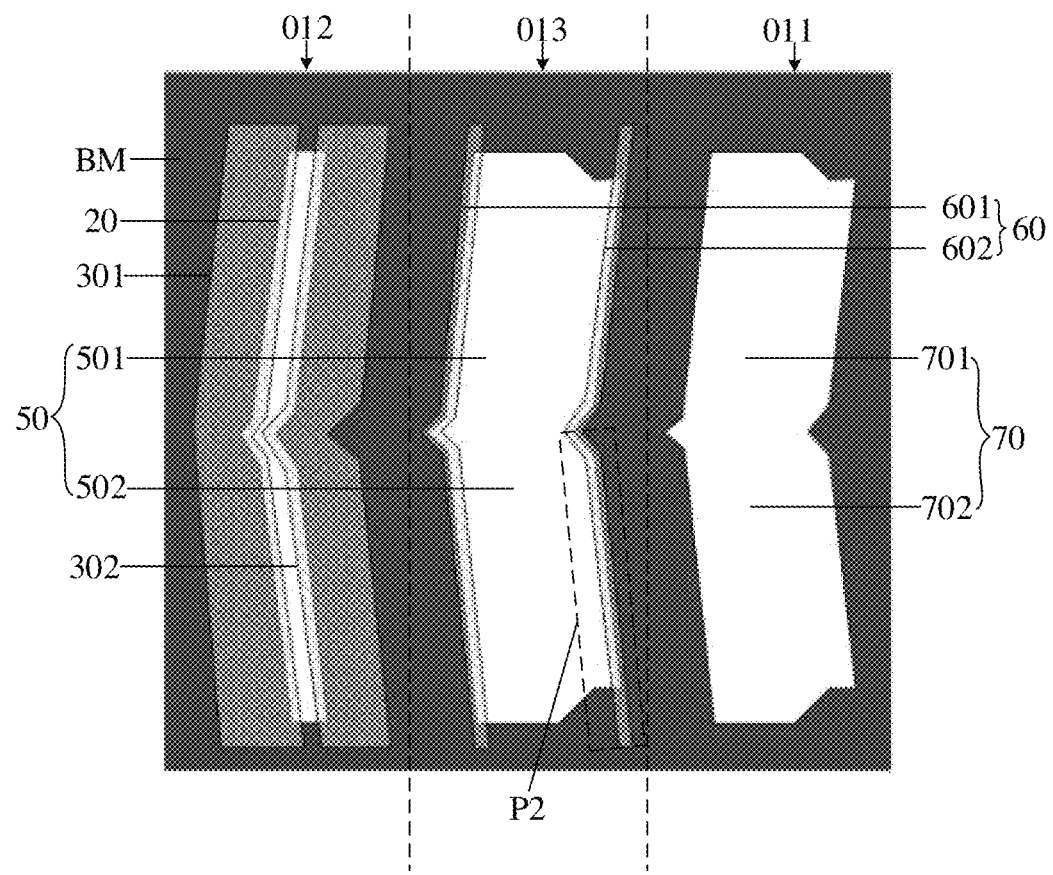
FIG. 10B is an enlarged view of a sub-pixel located in the edge display region, a sub-pixel located in the transition display region, and a sub-pixel located in the main display region in FIG. 10A.

In some embodiments, referring to FIGS. 10A and 10B, the area of the portion of the second opening 50 located in the transition display region 013 that is not blocked by the second metal pattern 60 is larger than the area of the portion of the first opening 20 located in the edge display region 012 that is not blocked by the first metal pattern 30. That is to say, the aperture ratio of the sub-pixel in the transition display region 013 is larger than the aperture ratio of the sub-pixel in the edge display region 012. In this way, when the display apparatus 100 displays a pure-color image, gray scales gradually change from the transition display region 013 to the edge display region 012, which may more effectively reduce the jagged phenomenon existing in the display region 01 and improve the display effect of the display apparatus 100.

Based on this, a portion of the black matrix pattern BM located in the main display region 011 has a plurality of third openings 70, and a third opening 70 is disposed in one corresponding sub-pixel in the main display region 011. An area of the third opening 70 is larger than the area of the portion of the second opening 50 located in the transition display region 013 that is not blocked by the second metal pattern 60. That is to say, the aperture ratio of the sub-pixel in the main display region 011 is larger than the aperture ratio of the sub-pixel in the transition display region 013. In this way, when the display apparatus 100 displays the pure-color image, gray scales gradually change from the main display region 013 to the transition display region 013, and then to the edge display region 012, which may more effectively reduce the jagged phenomenon existing in the display region 01 and improve the display effect of the display apparatus 100.

It will be noted that, referring to FIG. 10A, along a first direction L1, the transition display region 013 may be provided with one pixel 10, or may be provided with two or more pixels 10, which is not limited in the embodiments of the present disclosure. Herein, the first direction L1 is perpendicular to the first boundary line A1, and is a direction pointing from the main display region 011 to the edge display region 012.

In some embodiments, in a case where the transition display region 013 is provided with two or more pixels 10, aperture ratios of the pixels 10 in the transition display region 013 gradually decrease along the first direction L1. In this case, gray scales of the pixels 10 in the transition display region 013 gradually change along the first direction L1, which may further reduce the jagged phenomenon in the display region 01 and improve the display effect of the display apparatus 100.

For example, along the first direction L1, the transition display region 013 is provided with two pixels 10. The aperture ratio of each sub-pixel in the pixel 10 in the main display region 011 is 100%. Along the first direction L1, an aperture ratio of each sub-pixel in a pixel 10 in the transition display region 013 that is close to the main display region 011 is 80%, and an aperture ratio of each sub-pixel in a pixel 10 in the transition display region 013 that is close to the edge display region 012 is 60%. The aperture ratio of each sub-pixel in the pixel 10 in the edge display region 012 is 40%.

In this case, along the first direction L1, the aperture ratios of the sub-pixels in the pixels 10 in the transition display region 013 gradually decrease. Therefore, when the display apparatus 100 displays the pure-color image, the gray scales of the pixels 10 gradually change along the first direction L1, which may more effectively reduce the jagged phenomenon in the display region 01 and improve the display effect of the display apparatus 100.

Figure 12:
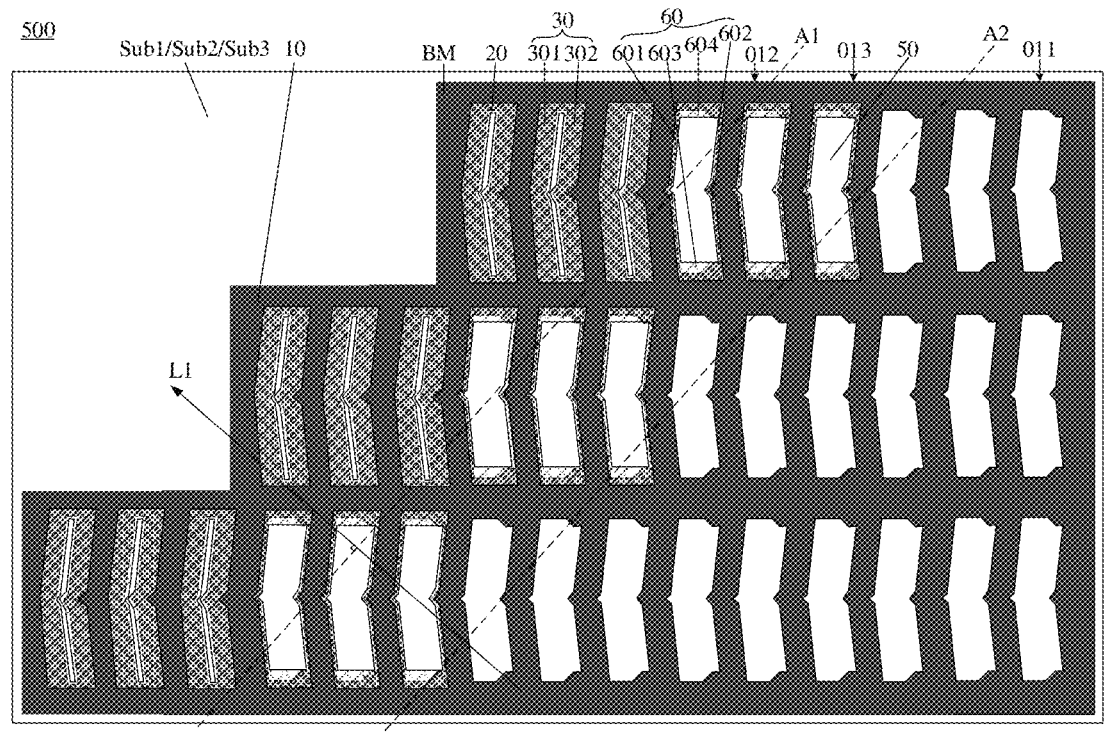
FIG. 12 is a top view of a part of yet another display apparatus substrate, in accordance with some embodiments.

A shape of the second opening 50 is not limited. In some embodiments, as shown in FIGS. 10A and 12, the second opening 50 is strip-shaped.

Here, the second opening 50 may be straight-strip-shaped. That is, the orthogonal projection of the strip-shaped second opening 50 on the reference plane substantially has a rectangular shape. Or, the strip-shaped second opening 50 may include a third strip-shaped opening 501 and a fourth strip-shaped opening 502, and an angle between the third strip-shaped opening 501 and the fourth strip-shaped opening 502 is an obtuse angle. FIGS. 10B and 13B show an example in which the strip-shaped second opening 50 includes the third strip-shaped opening 501 and the fourth strip-shaped opening 502.

In some embodiments, as shown in FIGS. 10A and 10B, the second opening 50 is strip-shaped, and the orthogonal projection of the second opening 50 on the reference plane has two opposite long sides. The two opposite long sides of the orthogonal projection of the second opening 50 on the reference plane are within orthogonal projection of the corresponding second metal pattern 60 on the reference plane.

For example, the second metal pattern 60 includes a fifth metal strip 601 and a sixth metal strip 602; extension directions of the fifth metal strip 601 and the sixth metal strip 602 are substantially the same as an extension direction of the second opening 50; and the two opposite long sides of the orthogonal projection of the second opening 50 on the reference plane are within orthogonal projections of the fifth metal strip 601 and the sixth metal strip 602 on the reference plane.

Here, a shape of the fifth metal strip 601 and a shape of the sixth metal strip 602 are the same as the shape of the second opening 50, which facilitates adjustment of an area of a portion of the second opening 50 that is covered by the fifth metal strip 601 and the sixth metal strip 602. For example, the second opening 50 includes the third strip-shaped opening 501 and the fourth strip-shaped opening 502, and the angle between the third strip-shaped opening 501 and the fourth strip-shaped opening 502 is the obtuse angle; and referring to FIGS. 10B and 13B, the shape of the fifth metal strip 601 and the shape of the sixth metal strip 602 are substantially the same as the shape of the second opening 50. That is, the fifth metal strip 601 and the sixth metal strip 602 each include two second metal sub-strips P2 connected to each other, and an angle between the two second metal sub-strips P2 is also an obtuse angle.

Based on this, as shown in FIG. 12, the second metal pattern 60 further includes a seventh metal strip 603 and an eighth metal strip 604; the fifth metal strip 601, the sixth metal strip 602, the seventh metal strip 603, and the eighth metal strip 604 are connected to form a frame shape. The orthogonal projection of the second opening 50 on the reference plane has two opposite short sides, and the two opposite short sides of the orthogonal projection of the second opening 50 on the reference plane are within orthogonal projections of the seventh metal strip 603 and the eighth metal strip 604 on the reference plane.

In this way, the aperture ratio of each sub-pixel in the transition display region 013 is determined only by an opening in the frame shape formed by the second metal pattern 60. Therefore, the aperture ratio of the sub-pixel may be accurately adjusted by directly adjusting a size of the opening in the frame shape of the second metal pattern 60, and in turn, the deviation between the aperture ratio of the sub-pixel and the preset value is reduced, and the aperture ratios of the sub-pixels in the same pixel 10 are the same or substantially the same. As a result, it may be possible to further reduce the color cast phenomenon caused by the different aperture ratios of the sub-pixels in the same pixel 10, and to improve the display effect of the display apparatus 100.

A shape of the third opening 70 is not limited. In some embodiments, as shown in FIG. 10A, the third opening 70 is strip-shaped.

Here, the third opening 70 may be straight-strip-shaped. That is, an orthogonal projection of the strip-shaped third opening 70 on the reference plane substantially has a rectangular shape. Or, the strip-shaped third opening 70 may include a fifth strip-shaped opening 701 and a sixth strip-shaped opening 702, and an angle between the fifth strip-shaped opening 701 and the sixth strip-shaped opening 702 is an obtuse angle. FIG. 10B shows an example in which the strip-shaped third opening 70 includes the fifth strip-shaped opening 701 and the sixth strip-shaped opening 702.

Figure 13A:
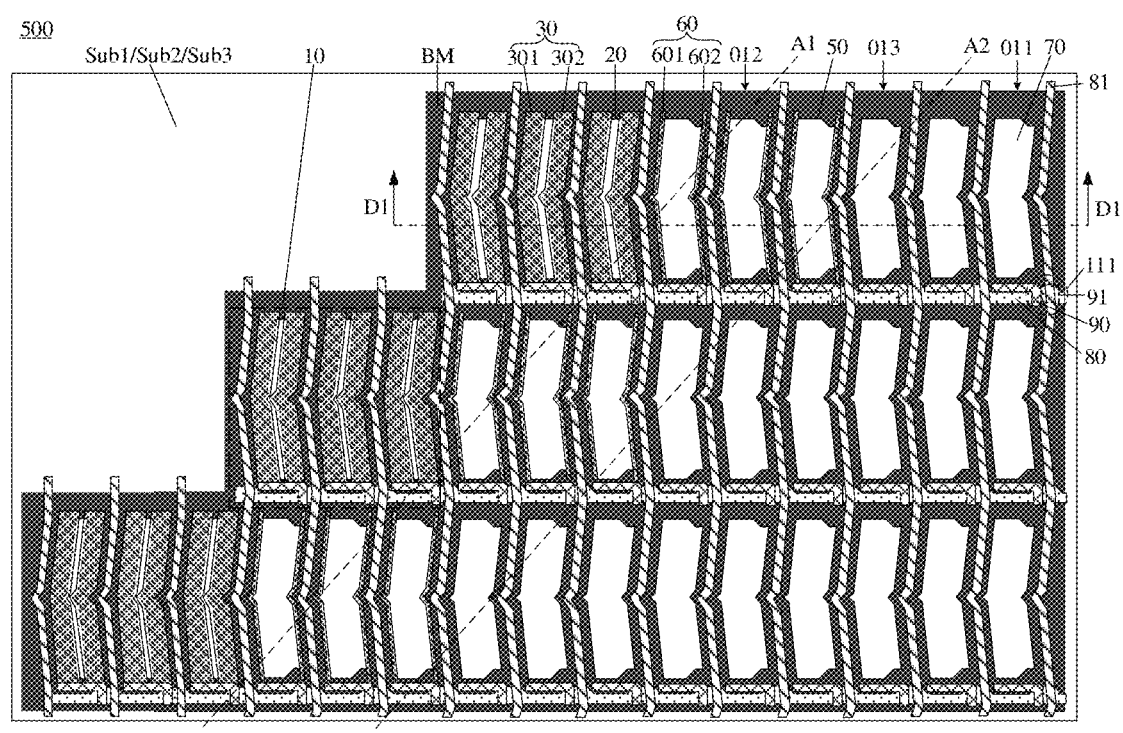
FIG. 13A is a top view of a part of yet another display apparatus substrate, in accordance with some embodiments.
Figure 13B:
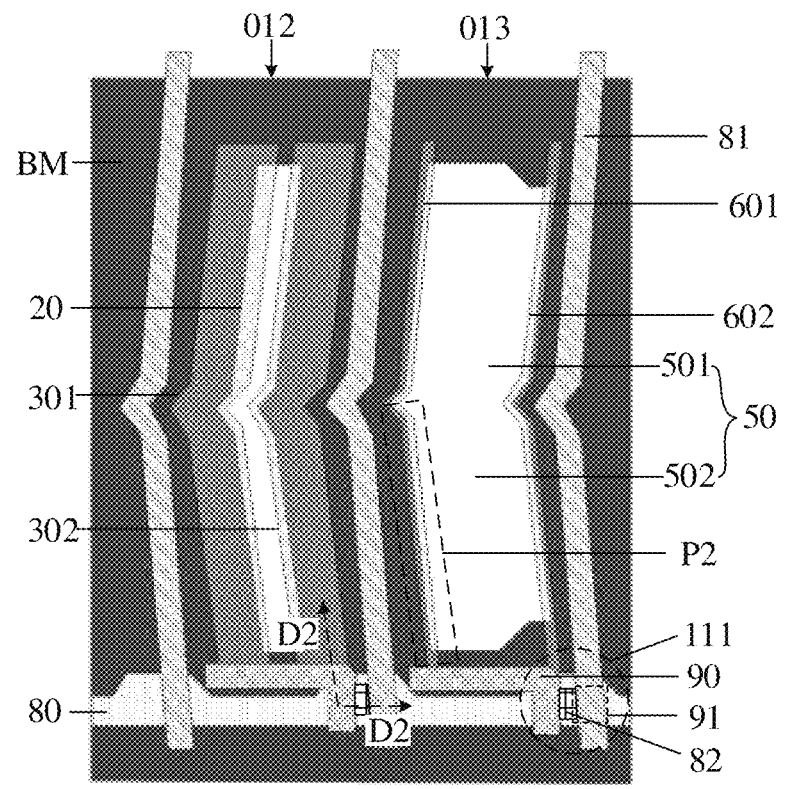
FIG. 13B is a local enlarged view of a sub-pixel located in the edge display region and a sub-pixel located in the transition display region in FIG. 13A.

In some embodiments, as shown in FIGS. 13A and 13B, the display apparatus substrate 500 further includes a plurality of data lines 81 and a plurality of gate lines 80. The plurality of first metal patterns 30 are made of a same material and arranged in a same layer as the plurality of data lines 81 or the plurality of gate lines 80; and/or, in a case where the display apparatus substrate 500 includes the plurality of second metal patterns 60, the plurality of second metal patterns 60 are made of a same material and arranged in a same layer as the plurality of data lines 81 or the plurality of gate lines 80. That is to say, the plurality of first metal patterns 30 are arranged in a source-drain metal layer (i.e., a layer where the plurality of data lines 81 are located) or a gate metal layer (i.e., a layer where the plurality of gate lines 80 are located); and/or, in the case where the display apparatus substrate 500 includes the plurality of second metal patterns 60, the plurality of second metal patterns 60 are arranged in the source-drain metal layer or the gate metal layer.

In this context, "same layer" means that a layer structure is formed by using a process as follows: a film used for forming specific patterns is formed by using a same film-forming process, and then a patterning process is performed on the film by using a same mask. Depending on different specific patterns, the patterning process may include multiple exposure, development or etching processes, and the specific patterns in the formed layer structure may be continuous or discontinuous, and these specific patterns may also be at different heights or have different thicknesses.

In the embodiments of the present disclosure, since the first metal patterns 30 are arranged in the same layer and made of the same material as the data lines 81 or the gate lines 80, the first metal patterns 30 may be simultaneously formed when the data lines 81 or the gate lines 80 are formed, thereby avoiding an increase in processes for manufacturing the display apparatus substrate 500 caused by arrangement of the first metal patterns 30. Since the second metal patterns 60 are arranged in the same layer and made of the same material as the data lines 81 or the gate lines 80, the second metal patterns 60 may be simultaneously formed when the data lines 81 or the gate lines 80 are formed, thereby avoiding an increase in processes for manufacturing the display apparatus substrate 500 caused by arrangement of the second metal patterns 60.

Figure 14A:
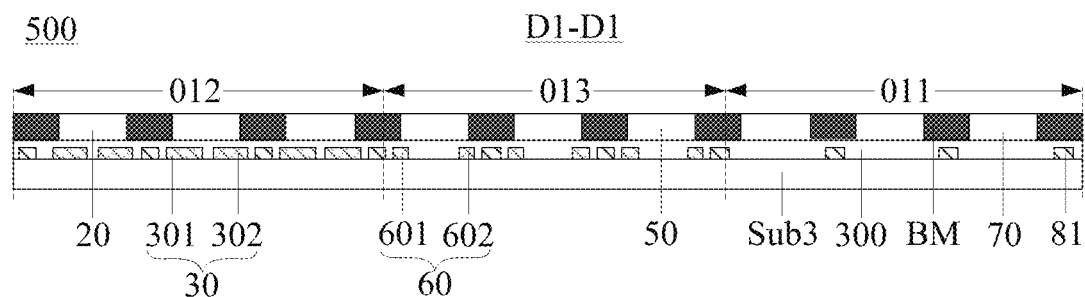
FIG. 14A is a sectional view taken along the line D1-D1 in FIG. 13A.
Figure 14B:
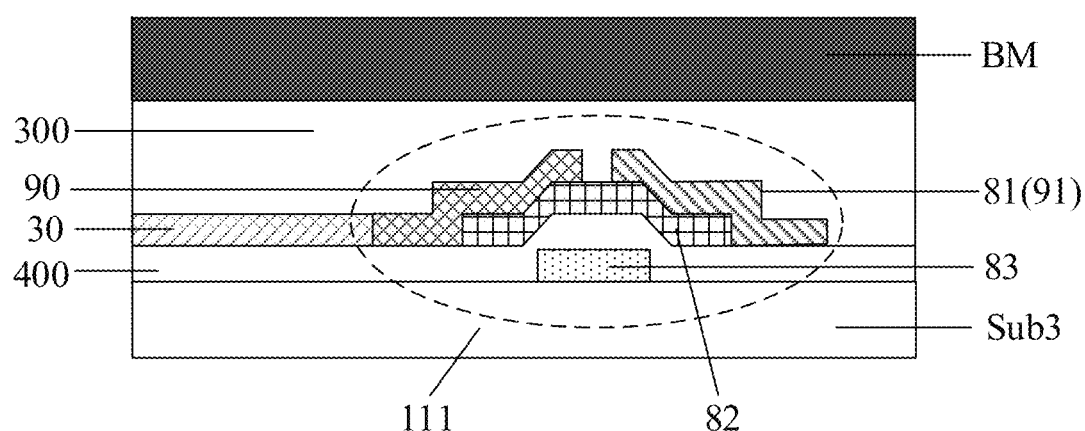
FIG. 14B is a sectional view taken along the line D2-D2 in FIG. 13B.
Figure 15A:
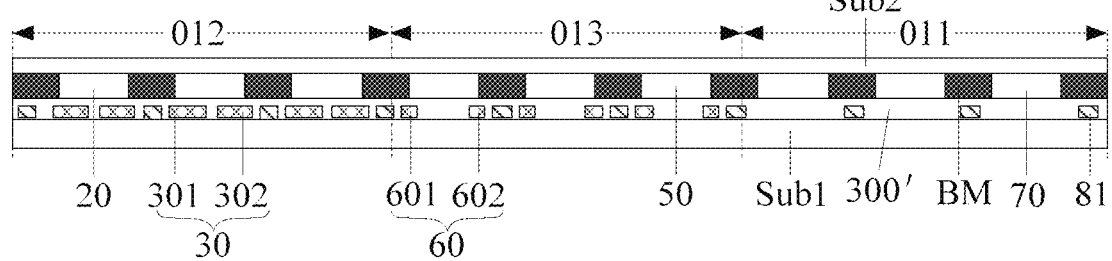
FIG. 15A is another sectional view taken along the line D1-D1 in FIG. 13A.
Figure 15B:
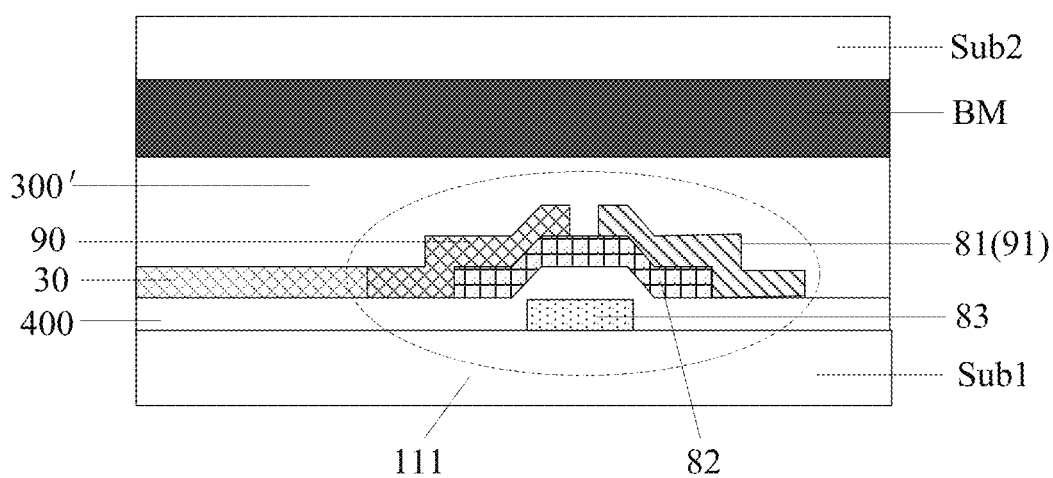
FIG. 15B is another sectional view taken along the line D2-D2 in FIG. 13B.

In some embodiments, as shown in FIGS. 13A and 13B, the display apparatus substrate 500 further includes a plurality of thin film transistors 111. Referring to FIGS. 14B and 15B, each thin film transistor 111 includes the gate 83, the active layer 82, the source 90 and the drain 91. The gate 83 is located in the gate metal layer, and the source 90 and the drain 91 are located in the source-drain metal layer. In addition, the display apparatus substrate 500 further includes a gate insulating layer 400 disposed between the gate metal layer and the active layer 82.

Each sub-pixel includes at least one thin film transistor 111. The first metal pattern 30 is electrically connected to the source 90 or the drain 91 of the thin film transistor 111 in the corresponding sub-pixel. In a case where the first metal pattern 30 is disposed in the source-drain metal layer, the first metal pattern 30 and the source 90 or the drain 91 of the corresponding thin film transistor 111 may be integrally arranged, so as to achieve an effect of electrically connecting the first metal pattern 30 to the source 90 or the drain 91 of the corresponding thin film transistor 111.

In the case where the display apparatus substrate 500 includes the second metal patterns 60, the second metal pattern 60 is electrically connected to the source 90 or the drain 91 of the thin film transistor 111 in the corresponding sub-pixel. In a case where the second metal pattern 60 is disposed in the source-drain metal layer, the second metal pattern 60 and the source 90 or the drain 91 of the corresponding thin film transistor 111 may be integrally arranged, so as to achieve an effect of electrically connecting the second metal pattern 60 to the source 90 or the drain 91 of the corresponding thin film transistor 111.

Here, a structure of the thin film transistor 111 is not limited. The thin film transistor 111 may be a bottom-gate thin film transistor, or may be a top-gate thin film transistor.

In addition, a type of the thin film transistor 111 is not limited. The thin film transistor 111 may be an N-type transistor, or may be a P-type transistor. A person skilled in the art will understand that, if the type of thin film transistor 111 is different, a connection manner between the data line 81 and the thin film transistor 111 is different. In a case where the thin film transistor 111 is the P-type transistor, the data line 81 is electrically connected to the source 90 of the thin film transistor 111. In a case where the thin film transistor 111 is the N-type transistor, the data line 70 is electrically connected to the drain 91 of the thin film transistor 111. FIGS. 13A and 13B show an example in which the data line 81 is electrically connected to the drain 91 of the thin film transistor 111.

It will be noted that, in a case where the data line 81 is electrically connected to the source 90 of the thin film transistor 111, a portion of the data line 81 may serve as the source 90. In a case where the data line 81 is electrically connected to the drain 91 of the thin film transistor 111, a portion of the data line 81 may serve as the drain 91. FIGS. 9A, 9B, 13A and 13B show an example in which the portion of the data line 81 serves as the drain 91.

Based on this, the first metal pattern 30 and the second metal pattern 60 may both be electrically connected to the source 90; or they may both be electrically connected to the drain 91. Of course, it may also be possible that the first metal pattern 30 is electrically connected to the source, and the second metal pattern 60 is electrically connected to the drain 91; or, the first metal pattern 30 is electrically connected to the drain 91, and the second metal pattern 60 is electrically connected to the source 90.

It will be understood that, in a case where the first metal pattern 30 is electrically connected to the source 90, when the first metal pattern 30 is formed, the first metal pattern 30 should be kept at a certain distance from the drain 91 to prevent the first metal pattern 30 from contacting the drain 91. In a case where the first metal pattern 30 is electrically connected to the drain 91, when the first metal pattern 30 is formed, the first metal pattern 30 should be kept at a certain distance from the source 90 to prevent the first metal pattern 30 from contacting the source 90.

Similarly, in a case where the second metal pattern 60 is electrically connected to the source 90, when the second metal pattern 60 is formed, the second metal pattern 30 should be kept at a certain distance from the drain 90 to prevent the second metal pattern 30 from contacting the drain 90. In a case where the second metal pattern 60 is electrically connected to the drain 91, when the second metal pattern 60 is formed, the second metal pattern 60 should be kept at a certain distance from the source 90 to prevent the second metal pattern 60 from contacting the source 90.

In the embodiments of the present disclosure, since the first metal pattern 30 is electrically connected to the source 90 or the drain 91, and the second metal pattern 60 is electrically connected to the source 90 or the drain 91, the static electricity on the first metal pattern 30 and the second metal pattern 60 may be discharged to an outside of the display apparatus substrate 500, thereby avoiding influence of the static electricity on the display apparatus 100 and ensuring the normal display of the display apparatus 100.

Figure 7A:
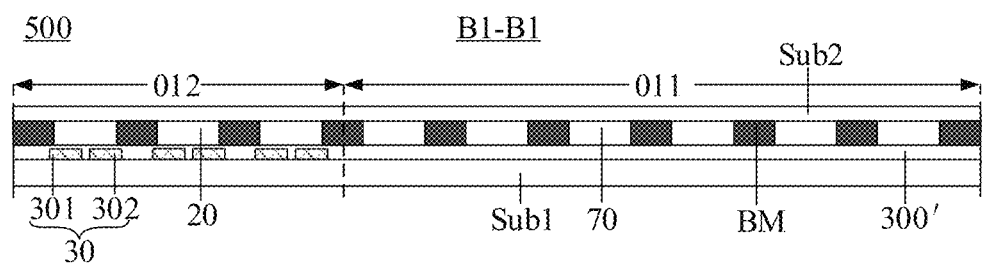
FIG. 7A is another sectional view taken along the line B1-B1 in FIG. 5A.
Figure 7B:
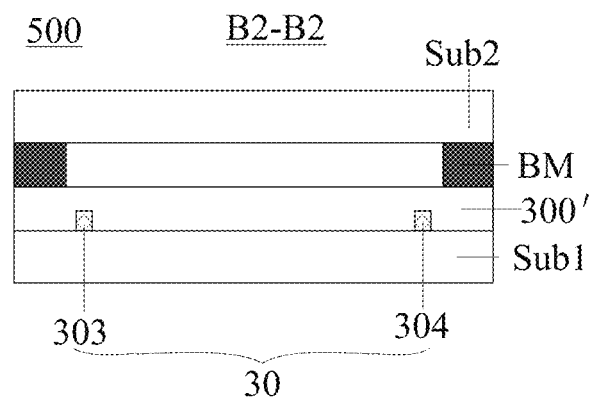
FIG. 7B is another sectional view taken along the line B2-B2 in FIG. 5A.
Figure 11A:
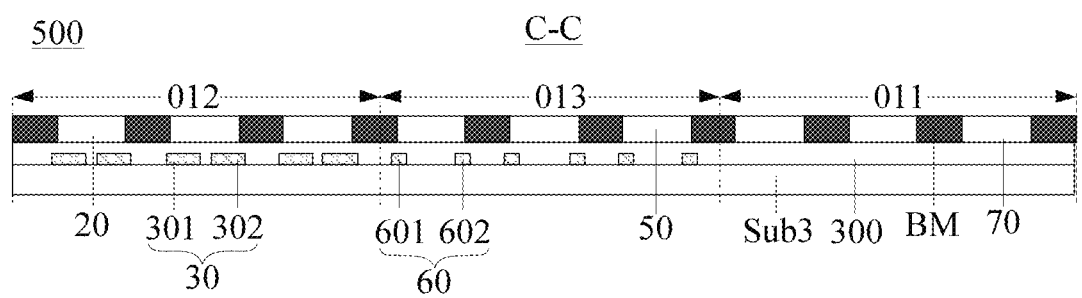
FIG. 11A is a sectional view taken along the line C-C in FIG. 10A.
Figure 11B:
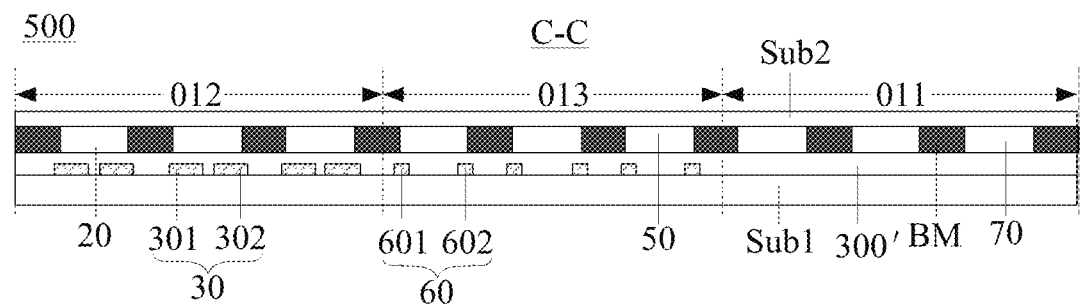
FIG. 11B is another sectional view taken along the line C-C in FIG. 10A.

In some embodiments, referring to FIGS. 7A and 7B, the display apparatus substrate 500 includes the first base Sub1 and the second base Sub2; and the plurality of first metal patterns 30 are disposed on the first base Sub1, and the black matrix pattern BM is disposed on the second base Sub2. Referring to FIGS. 11B and 15A, in the case where the display apparatus substrate 500 includes the plurality of second metal patterns 60, the plurality of second metal patterns 60 are disposed on the first base Sub1.

In the case where the display apparatus 100 including the display apparatus substrate 500 is the liquid crystal display apparatus, as shown in FIG. 4A, the above first base Sub1 is the first base Sub1 of the array substrate 13 of the liquid crystal display apparatus, and the above second base Sub2 is the second base Sub2 of the opposite substrate 14 of the liquid crystal display apparatus. In this case, referring to FIGS. 4A and 11B, the display apparatus substrate 500 may be the liquid crystal display panel of the liquid crystal display apparatus. In a case where the first metal pattern 30 and the second metal pattern 60 are located in the gate metal layer or the source-drain metal layer of the liquid crystal display panel, the first metal pattern 30 and the second metal pattern 60 are closer to the first base Sub1 than the black matrix pattern BM.

In the case where the display apparatus 100 including the display apparatus substrate 500 is the electroluminescent display apparatus, as shown in FIG. 3A, the above first base Sub1 is the first base Sub1 of the display substrate 11 of the electroluminescent display apparatus, and the above second base Sub2 is the second base Sub2 of the encapsulation substrate of the electroluminescent display apparatus. In this case, referring to FIGS. 3A and 11B, the display apparatus substrate 500 may be the electroluminescent display panel of the electroluminescent display apparatus.

In addition, referring to FIGS. 7A, 7B, 11B, 15A and 15B, in a case where the first metal pattern 30 and the second metal pattern 60 are located in the gate metal layer or the source-drain metal layer of the electroluminescent display panel, the first metal pattern 30 and the second metal pattern 60 are closer to the first base Sub1 than the black matrix pattern BM. In addition, at least one insulating protective layer 300' is provided between the layer (i.e., the gate metal layer or the source-drain metal layer) where the first metal pattern 30 and the second metal pattern 60 are located and the black matrix pattern BM. For example, referring to FIGS. 3A and 4A, the first metal pattern 30 and the second metal pattern 60 are located in the source-drain metal layer, the at least one insulating protective layer 300' includes at least a planarization layer 116 or a second insulating layer 134.

In some other embodiments, referring to FIGS. 6A and 6B, the display apparatus substrate 500 includes one base, i.e., the third base Sub3, and the black matrix pattern BM and the plurality of first metal patterns 30 that are all disposed on the base Sub3. Referring to FIGS. 11A and 14A, in the case where the display apparatus substrate 500 includes the plurality of second metal patterns 60, the plurality of second metal patterns 60 may also be disposed on the third base Sub3.

In the case where the display apparatus 100 including the display apparatus substrate 500 is the liquid crystal display apparatus, as shown in FIG. 4B, the above third base Sub3 is the third base Sub3 of the array substrate 13 of the liquid crystal display apparatus. In this case, referring to FIGS. 4B and 11A, the display apparatus substrate may be the array substrate 13 of the liquid crystal display apparatus. In the case where the first metal pattern 30 and the second metal pattern 60 are located in the gate metal layer or the source-drain metal layer of the array substrate 13, the first metal pattern 30 and the second metal pattern 60 are closer to the third base Sub3 than the black matrix pattern BM.

In the case where the display apparatus 100 including the display apparatus substrate 500 is the electroluminescent display apparatus, as shown in FIG. 3B, the above third base Sub3 is the third base Sub3 of the display substrate 11 of the electroluminescent display apparatus. In this case, referring to FIGS. 3B and 11A, the display apparatus substrate 500 may be the display substrate 11 of the electroluminescent display apparatus, or may be the electroluminescent display panel of the electroluminescent display apparatus.

In addition, referring to FIGS. 6A, 6B, 11A, 14A and 14B, in the case where the first metal pattern 30 and the second metal pattern 60 are located in the gate metal layer or the source-drain metal layer of the array substrate 13, the first metal pattern 30 and the second metal pattern 60 are closer to the third base Sub3 than the black matrix pattern BM. In addition, at least one insulating protective layer 300 is provided between the layer (i.e., the gate metal layer or the source-drain metal layer) where the first metal pattern 30 and the second metal pattern 60 are located and the black matrix pattern BM. For example, referring to FIGS. 3B and 4B, in the case where the first metal pattern 30 and the second metal pattern 60 are located in the source-drain metal layer, the at least one insulating protection layer 300 includes at least a planarization layer 116 or a second insulating layer 134.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display apparatus substrate, having a non-rectangular display region, the display region including a main display region and at least one edge display region located at a periphery of the main display region, the display region being provided with a plurality of pixels therein, and each pixel including at least three sub-pixels, the display apparatus substrate comprising:
    a black matrix pattern, a first portion of the black matrix pattern being located in the at least one edge display region, the first portion of the black matrix pattern having a plurality of first openings, and a first opening being disposed in one corresponding sub-pixel in the at least one edge display region; a second portion of the black matrix pattern being located in the main display region, the second portion of the black matrix pattern having a plurality of third openings, and a third opening being disposed in one corresponding sub-pixel in the main display region; and
    a plurality of first metal patterns disposed in the at least one edge display region and configured to block light, a first metal pattern corresponding to one first opening and being disposed in the corresponding sub-pixel in the at least one edge display region, and an orthogonal projection of the first metal pattern on a reference plane overlapping a partial region of an orthogonal projection of the corresponding first opening on the reference plane, wherein the reference plane is a plane perpendicular to a thickness direction of the display apparatus substrate;
    wherein none of the first metal patterns is disposed in a region corresponding to the third opening in the main display region, and an area of the third opening is larger than an area of a portion of the first opening located in the at least one edge display region that is not blocked by the first metal pattern;
    wherein at least a part of a border of the orthogonal projection of the first opening on the reference plane is within the orthogonal projection of the corresponding first metal pattern on the reference plane;

wherein the first opening is strip-shaped, and the orthogonal projection of the first opening on the reference plane has two opposite long sides; and the two opposite long sides of the orthogonal projection of the first opening on the reference plane are within the orthogonal projection of the corresponding first metal pattern on the reference plane;

wherein the display apparatus substrate is an electroluminescent display panel, or a display substrate of the electroluminescent display panel, the display apparatus substrate further comprises a plurality of light-emitting devices, and each sub-pixel includes a light-emitting device; or the display apparatus substrate is a liquid crystal display panel, or an array substrate of the liquid crystal display panel, the display apparatus substrate further comprises a plurality of pixel electrodes, and each sub-pixel includes a pixel electrode.

2. The display apparatus substrate according to claim 1, wherein in the at least one edge display region, areas of portions, which are not blocked by first metal patterns, of first openings in sub-pixels that belong to a same pixel are substantially the same.

3. The display apparatus substrate according to claim 1, wherein the first metal pattern includes a first metal strip and a second metal strip;

extension directions of the first metal strip and the second metal strip are substantially the same as an extension direction of the first opening; and the two opposite long sides of the orthogonal projection of the first opening on the reference plane are within orthogonal projections of the first metal strip and the second metal strip on the reference plane.

4. The display apparatus substrate according to claim 3, wherein the first metal pattern further includes a third metal strip and a fourth metal strip;

the first metal strip, the second metal strip, the third metal strip and the fourth metal strip are connected to form a frame shape; and the orthogonal projection of the first opening on the reference plane has two opposite short sides; and the two opposite short sides of the orthogonal projection of the first opening on the reference plane are within orthogonal projections of the third metal strip and the fourth metal strip on the reference plane.

5. The display apparatus substrate according to claim 1, wherein the display region further includes at least one transition display region located between the main display region and the at least one edge display region;

a third portion of the black matrix pattern is located in the at least one transition display region, the third portion of the black matrix pattern has a plurality of second openings, and a second opening is disposed in one corresponding sub-pixel in the at least one transition display region; and the display apparatus substrate further comprises:

a plurality of second metal patterns disposed in the at least one transition display region and configured to block the light, a second metal pattern corresponding to one second opening and being disposed in the corresponding sub-pixel in the at least one transition display region, and an orthogonal projection of the second metal pattern on the reference plane overlapping a partial region of an orthogonal projection of the corresponding second opening on the reference plane.

6. The display apparatus substrate according to claim 5, wherein in the at least one transition display region, areas of portions, which are not blocked by second metal patterns, of second openings in sub-pixels that belong to a same pixel are substantially the same.

7. The display apparatus substrate according to claim 5, wherein an area of a portion of the second opening located in the at least one transition display region that is not blocked by the second metal pattern is larger than the area of the portion of the first opening located in the at least one edge display region that is not blocked by the first metal pattern.

8. The display apparatus substrate according to claim 7, wherein the area of the third opening is larger than the area of the portion of the second opening located in the at least one transition display region that is not blocked by the second metal pattern.

9. The display apparatus substrate according to claim 5, wherein the second opening is strip-shaped, and the orthogonal projection of the second opening on the reference plane has two opposite long sides; and the two opposite long sides of the orthogonal projection of the second opening on the reference plane are within the orthogonal projection of the corresponding second metal pattern on the reference plane.

10. The display apparatus substrate according to claim 9, wherein the second metal pattern includes a fifth metal strip and a sixth metal strip;

extension directions of the fifth metal strip and the sixth metal strip are substantially the same as an extension direction of the second opening; and the two opposite long sides of the orthogonal projection of the second opening on the reference plane are within orthogonal projections of the fifth metal strip and the sixth metal strip on the reference plane.

11. The display apparatus substrate according to claim 10, wherein the second metal pattern further includes a seventh metal strip and an eighth metal strip, the fifth metal strip, the sixth metal strip, the seventh metal strip and the eighth metal strip are connected to form a frame shape; and the orthogonal projection of the second opening on the reference plane has two opposite short sides; and the two opposite short sides of the orthogonal projection of the second opening on the reference plane are within orthogonal projections of the seventh metal strip and the eighth metal strip on the reference plane.

12. The display apparatus substrate according to claim 1, further comprising:

a plurality of gate lines and a plurality of data lines;

a plurality of thin film transistors, each thin film transistor including a source and a drain, wherein the plurality of first metal patterns are made of a same material and arranged in a same layer as the plurality of gate lines or the plurality of data lines;

each sub-pixel further includes at least one thin film transistor; and the first metal pattern is electrically connected to the source or the drain of a thin film transistor in a corresponding sub-pixel.

13. The display apparatus substrate according to claim 1, further comprising:

a first base and a second base, wherein the plurality of first metal patterns are disposed on the first base, and the black matrix pattern is disposed on the second base.

14. A display apparatus, comprising the display apparatus substrate according to claim 1.

15. The display apparatus substrate according to claim 5, further comprising a plurality of gate lines and a plurality of data lines, wherein the plurality of second metal patterns are made of a same material and arranged in a same layer as the plurality of gate lines or the plurality of data lines.

16. The display apparatus substrate according to claim 15, further comprising a plurality of thin film transistors, each thin film transistor including a source and a drain; wherein each sub-pixel further includes at least one thin film transistor; and a second metal pattern is electrically connected to a source or a drain of a thin film transistor in the corresponding sub-pixel in the at least one transition display region.

17. The display apparatus substrate according to claim 5, further comprising:

a first base and a second base, wherein the plurality of first metal patterns and the plurality of second metal patterns are disposed on the first base, and the black matrix pattern is disposed on the second base.

18. The display apparatus substrate according to claim 1, further comprising:

a base, wherein the black matrix pattern and the plurality of first metal patterns are all disposed on the base.

19. The display apparatus substrate according to claim 5, further comprising:

a base, wherein the black matrix pattern, the plurality of first metal patterns and the plurality of second metal patterns are all disposed on the base.

* * * * *